(12) United States Patent
Oganesian

(10) Patent No.: US 8,692,344 B2
(45) Date of Patent: Apr. 8, 2014

(54) BACK SIDE ILLUMINATED IMAGE SENSOR ARCHITECTURE, AND METHOD OF MAKING SAME

(75) Inventor: Vage Oganesian, Sunnyvale, CA (US)

(73) Assignee: Optiz, Inc, Palo Alto, CA (US)

( * ) Notice: Subject to any disclaimer, the term of this patent is extended or adjusted under 35 U.S.C. 154(b) by 91 days.

(21) Appl. No.: 13/423,045

(22) Filed: Mar. 16, 2012

(65) Prior Publication Data

US 2013/0242155 A1    Sep. 19, 2013

(51) Int. Cl.
*H01L 27/14* (2006.01)
*H04N 5/374* (2011.01)

(52) U.S. Cl.
USPC ............ 257/431; 257/432; 257/433; 348/308

(58) Field of Classification Search
USPC .................. 257/431, 432, 433, 443, 447, 448
See application file for complete search history.

(56) References Cited

U.S. PATENT DOCUMENTS

| | | | |
|---|---|---|---|
| 6,777,767 B2 | 8/2004 | Badehi | |
| 6,972,480 B2 | 12/2005 | Zilber et al. | |
| 7,033,664 B2 | 4/2006 | Zilber et al. | |
| 7,157,742 B2 | 1/2007 | Badehi | |
| 7,192,796 B2 | 3/2007 | Zilber et al. | |
| 7,265,440 B2 | 9/2007 | Zilber et al. | |
| 7,495,341 B2 | 2/2009 | Zilber et al. | |
| 7,642,629 B2 | 1/2010 | Zilber et al. | |
| 7,859,033 B2 | 12/2010 | Brady | |
| 7,923,799 B2 * | 4/2011 | Lenchenkov | 257/432 |
| 2004/0251525 A1 | 12/2004 | Zilber | |
| 2005/0104179 A1 | 5/2005 | Zilber | |
| 2005/0205977 A1 | 9/2005 | Zilber | |
| 2007/0138498 A1 | 6/2007 | Zilber | |
| 2007/0190691 A1 | 8/2007 | Humpston | |
| 2007/0190747 A1 | 8/2007 | Humpston | |
| 2008/0012115 A1 | 1/2008 | Zilber | |
| 2008/0017879 A1 | 1/2008 | Zilber | |
| 2008/0083976 A1 | 4/2008 | Haba | |
| 2008/0083977 A1 | 4/2008 | Haba | |
| 2008/0099900 A1 | 5/2008 | Oganesian | |
| 2008/0099907 A1 | 5/2008 | Oganesian | |
| 2008/0116544 A1 | 5/2008 | Grinman | |
| 2008/0116545 A1 | 5/2008 | Grinman | |
| 2008/0150121 A1 | 6/2008 | Oganesian | |

(Continued)

OTHER PUBLICATIONS

U.S. Appl. No. 13/157,193, filed Jun. 9, 2011, Oganesian, Vage.

(Continued)

*Primary Examiner* — Zandra Smith
*Assistant Examiner* — Paul Patton
(74) *Attorney, Agent, or Firm* — DLA Piper LLP (US)

(57) ABSTRACT

An image sensor device that includes a substrate and a plurality of color filters. The substrate includes a plurality of photo detectors (wherein a first portion of the plurality of photo detectors each has a lateral size that is smaller than that of each of a second portion of the plurality of photo detectors) and a plurality of contact pads which are electrically coupled to the photo detectors. The plurality of color filters are each disposed over one of the photo detectors. The plurality of photo detectors are configured to produce electronic signals in response to light incident through the color filters. A third portion of the plurality of photo detectors are laterally disposed between the first and second portions of the photo detectors, and each having a lateral size between those of the first and second portions of the photo detectors.

14 Claims, 24 Drawing Sheets

(56) References Cited

U.S. PATENT DOCUMENTS

| | | |
|---|---|---|
| 2008/0246136 A1 | 10/2008 | Haba |
| 2009/0115047 A1 | 5/2009 | Haba |
| 2009/0160065 A1 | 6/2009 | Haba |
| 2009/0200625 A1* | 8/2009 | Venezia et al. ............... 257/432 |
| 2009/0212381 A1 | 8/2009 | Crisp |
| 2010/0053407 A1 | 3/2010 | Crisp |
| 2010/0225006 A1 | 9/2010 | Haba |
| 2010/0230812 A1 | 9/2010 | Oganesian |
| 2010/0237452 A1 | 9/2010 | Hagiwara et al. |
| 2011/0012259 A1 | 1/2011 | Grinman |
| 2011/0031629 A1 | 2/2011 | Haba |
| 2011/0033979 A1 | 2/2011 | Haba |
| 2011/0049696 A1 | 3/2011 | Haba |
| 2011/0187007 A1 | 8/2011 | Haba |
| 2012/0018863 A1 | 1/2012 | Oganesian |
| 2012/0018868 A1 | 1/2012 | Oganesian |
| 2012/0018893 A1 | 1/2012 | Oganesian |
| 2012/0018894 A1 | 1/2012 | Oganesian |
| 2012/0018895 A1 | 1/2012 | Oganesian |
| 2012/0020026 A1 | 1/2012 | Oganesian |
| 2012/0068327 A1 | 3/2012 | Oganesian |
| 2012/0068330 A1 | 3/2012 | Oganesian |
| 2012/0068351 A1 | 3/2012 | Oganesian |
| 2012/0068352 A1 | 3/2012 | Oganesian |
| 2012/0199924 A1 | 8/2012 | Oganesian et al. |
| 2012/0199925 A1 | 8/2012 | Oganesian et al. |
| 2012/0199926 A1 | 8/2012 | Oganesian et al. |

OTHER PUBLICATIONS

U.S. Appl. No. 13/157,202, filed Jun. 9, 2011, Oganesian, Vage.
U.S. Appl. No. 13/157,207, filed Jun. 9, 2011, Oganesian, Vage.
U.S. Appl. No. 13/186,357, filed Jul. 19, 2011, Oganesian, Vage.
U.S. Appl. No. 13/225,092, filed Sep. 2, 2011, Oganesian, Vage.
U.S. Appl. No. 13/301,683, filed Nov. 21, 2011, Oganesian, Vage.
U.S. Appl. No. 13/312,826, filed Dec. 6, 2011, Oganesian, Vage.
U.S. Appl. No. 13/343,682, filed Jan. 4, 2012, Oganesian, Vage.
U.S. Appl. No. 13/427,604, filed Mar. 22, 2012, Oganesian, Vage.
U.S. Appl. No. 13/356,328, filed Jan. 23, 2012, Oganesian, Vage.
U.S. Appl. No. 13/468,632, filed May 10, 2012, Oganesian, Vage.
U.S. Appl. No. 13/559,510, filed Jul. 26, 2012, Oganesian, Vage.
U.S. Appl. No. 13/609,002, filed Sep. 10, 2012, Oganesian, Vage.

* cited by examiner

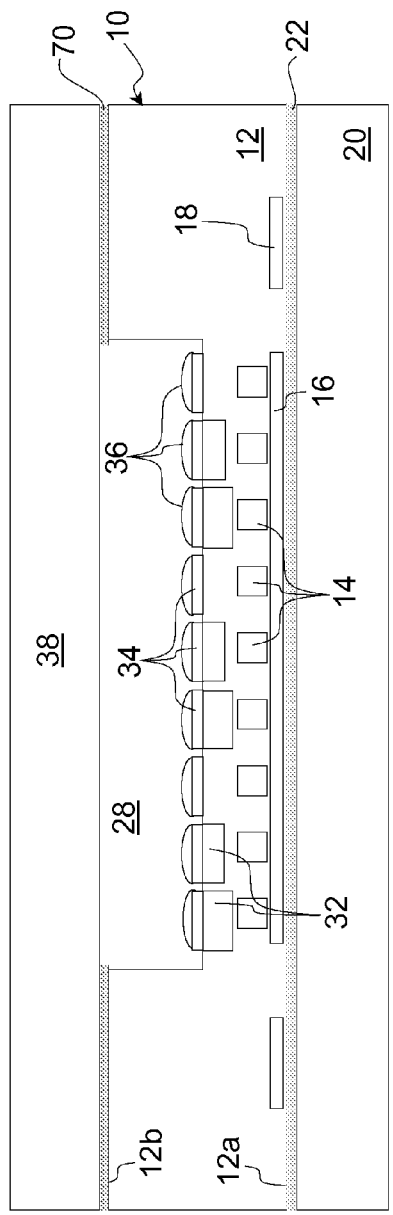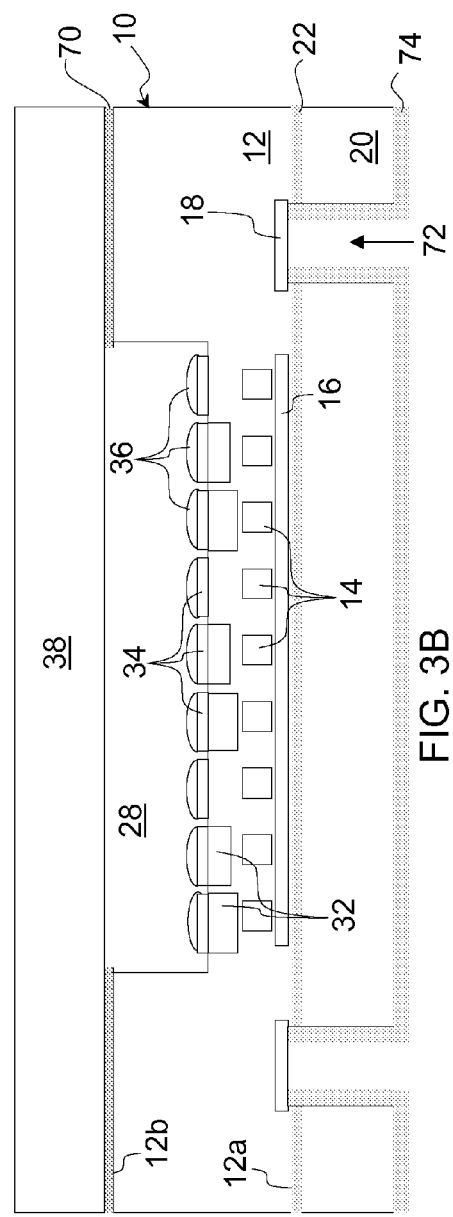

BACK SIDE ILLUMINATED IMAGE SENSOR ARCHITECTURE, AND METHOD OF MAKING SAME

FIELD OF THE INVENTION

The present invention relates to CMOS image sensors, and more particularly to a back side illuminated image sensor and packaging configuration.

BACKGROUND OF THE INVENTION

The trend for semiconductor devices is smaller integrated circuit (IC) devices (also referred to as chips), packaged in smaller packages (which protect the chip while providing off chip signaling connectivity). One example are image sensors, which are IC devices that include photo-detectors which transform incident light into electrical signals (that accurately reflect the intensity and color information of the incident light with good spatial resolution). Image sensors can be front side illuminated (FSI) or back side illuminated (BSI).

A conventional front side illuminated (FSI) image sensor has photo-detectors formed at the surface of silicon chip at which light being imaged is incident. The supporting circuitry for the photo-detectors is formed over the photo-detectors, where apertures (i.e. light pipes) allow light to pass through the circuitry layers to reach the photo-detectors. The color filters and micro-lens are disposed over the surface containing the photo-detectors. The drawback with FSI image sensors is that the circuitry layers limit the size of the aperture through which incident light for each pixel must travel. As pixel size shrinks due to demands for higher numbers of pixels and smaller chip sizes, the ratio of pixel area to the overall sensor area decreases. This reduces the quantum efficiency (QE) of the sensor.

A conventional back side illuminated (BSI) image sensor is similar to an FSI image sensor, except the photo-detectors receive light through the back surface of the chip (i.e. the light enters the back surface of the chip, and travels through the silicon substrate until it reaches the photo-detectors). The color filters and micro-lens are mounted to the back surface of the chip. With this configuration, the incident light avoids the circuitry layers. However, the drawbacks with BSI image sensors include pixel cross-talk caused by diffusion in the silicon substrate (i.e. there is no circuitry or other structure that forms apertured openings to segregate the propagating light for each pixel—blue light is especially susceptible to this diffusion phenomenon) and the need for a thicker micro-lens due to shorter optical paths.

Another significant issue with BSI image sensors is that the quantum efficiency of different colors of light passing through the silicon substrate varies because the amount of the light absorbed (i.e. attenuated) by the silicon varies based upon wavelength. This means that with a uniform thickness silicon substrate, the amount of absorption of red, green and blue colors headed for the photo-detectors is not the same. In order to equalize attenuation, the different colors would have to pass through different thicknesses of the silicon. The absorption coefficients for silicon, and thickness ratios of silicon for equalizing attenuation, are provided in the table below for three different colors of light:

TABLE 1

| Color | Exemplary Wavelength (nm) | Absorption coefficient (1/cm) | Thickness ratio |
|---|---|---|---|
| Blue | 475 | 16,000 | 1.00 |
| Green | 510 | 9700 | 1.65 |
| Red | 650 | 2810 | 5.70 |

From the above, as an example, a silicon thickness of 1 μm for blue, 1.65 μm for green and 5.70 μm for red would yield a uniform absorption for all three color wavelengths. Another measure of absorption is "absorption depth," which is the thickness of the substrate at which about 64% (1−1/e) of the original intensity is absorbed, and about 36% (1/e) gets through. The table shows that a silicon thickness of 0.625 μm for the blue, 1.03 μm for the green and 3.56 μm for the red would yield a uniform absorption of about 64%, with 36% of the light making it through the silicon.

Any color, within limits, may represented by a linear combination of three additive primary colors, such as red, green, and blue. To enable a sensor array to sense color, a color filter array having red, green, and blue filter elements is overlaid on the sensor array so that each filter element of the color filter array is aligned with one photo detector of the sensor array (i.e. each photo detector and its associated color filter form a pixel of the image being captured). The red filter elements block green and blue light, and allow only red light to reach the corresponding photo detectors of the sensor array, which therefore output only red color components of the image. The green filter elements block red and blue light, and allow only green light to reach the corresponding photo detectors of sensor array, which therefore output only green color components of the image. The blue filter elements block red and green light, and allow only blue light to reach the corresponding photo detectors of the sensor array, which therefore output only blue color components of the image. Thus, two-thirds of the light incident on the color filter array is blocked from reaching the sensor array, significantly reducing the overall detection sensitivity of the sensor array for a color image, thereby significantly reducing the resolution of the sensor array for a color image.

A common method to capture color information in cameras using semiconductor based image sensors is to employee a mosaic, such as a Bayer pattern, of alternating red, green, and blue pixels. The light reaching these pixels is filtered by corresponding red, green, or blue light filter films made out of materials such as polyimide.

Unfortunately, as the pixel size becomes smaller, some of the light is not focused onto the photo detectors, which causes light to be lost and pixel response to decrease. The chief ray is the ray which passes through the center of an entrance pupil, and light near the center of the entrance pupil enters the pixels at the center of the array. The angle of the chief ray is commonly called the chief ray angle (CRA). At the peripheral edge of the sensing array, the pixel response drops below a certain percentage (e.g., 80%) of its zero degree angle response (where the pixel is perpendicular to incident light). The light incident near the center axis of sensor array enters the pixels near parallel to the center axis. However light incident further from the center axis enters the pixels at angles not parallel to the center axis. As a result, there can be crosstalk between the pixels that are located away from the center of the array. Crosstalk creates noise in the image sensor.

There is a need for an improved BSI image sensor configuration to make absorption of incident light through the silicon substrate substantially uniform for multiple wavelengths. There is also a need for an improved package and packaging technique for BSI image sensor chips that can provide a low profile wafer level packaging solution that is cost effective and reliable (i.e. provides the requisite mechanical support and electrical connectivity), which means that packaging solution will need to be able to integrate front end and back end processes. There is also a need for an image sensor that optimizes and improves the image quality by increasing quantum efficiency and reducing pixel crosstalk.

BRIEF SUMMARY OF THE INVENTION

The aforementioned problems and needs are addressed by an image sensor device that comprises a substrate that includes a plurality of photo detectors, wherein a first portion of the plurality of photo detectors each has a lateral size that is smaller than that of each of a second portion of the plurality of photo detectors, and a plurality of contact pads which are electrically coupled to the photo detectors, and a plurality of color filters each disposed over one of the photo detectors. The plurality of photo detectors are configured to produce electronic signals in response to light incident through the color filters.

Other objects and features of the present invention will become apparent by a review of the specification, claims and appended figures.

BRIEF DESCRIPTION OF THE DRAWINGS

FIGS. 3A-3D are cross sectional side views showing in sequence the steps in forming a second alternate embodiment of the packaged image sensor.

DETAILED DESCRIPTION OF THE INVENTION

The present invention is an improved BSI image sensor and packaging which reduces the amount of substrate attenuation variations based upon wavelength, and method of making the same.

Figure 1A:
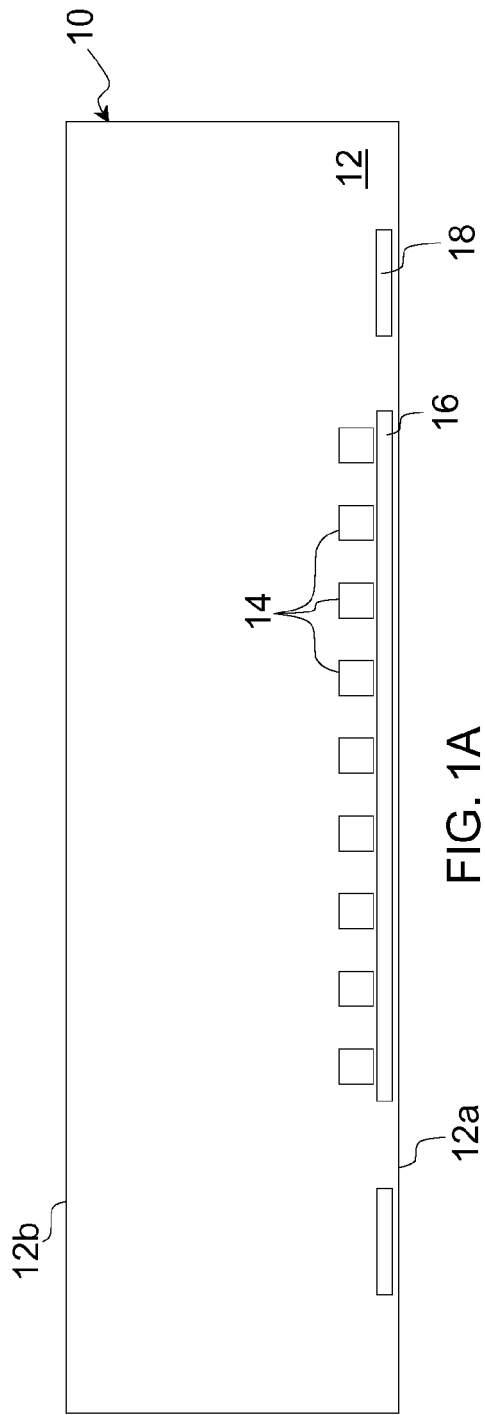
FIGS. 1A-1G are cross sectional side views showing in sequence the steps in forming the packaged image sensor.

The method of fabricating the packaged image sensor involves the simultaneous manufacturing and packaging of the BSI image sensor. The method begins with a conventional BSI image sensor chip 10 illustrated in FIG. 1A. Chip 10 includes a substrate 12 on which a plurality of photo detectors 14 and supporting circuitry 16 are formed, along with contact pads 18. The photo detectors 14, supporting circuitry 16 and contact pads 18 are formed at the downwardly facing (front) surface 12a of substrate 12. Preferably, all the supporting circuitry 16 is formed below photo detectors 14 (closer to the front surface 12a) so that circuitry 16 does not obstruct light entering through the back surface 12b and traveling through substrate 10 toward the photo detectors 14. The contact pads 18 are electrically coupled to the photo detectors 14 via supporting circuitry 16 for providing off chip signaling. Each photo detector 14 converts light energy incident on back surface 12b and reaching the photo detectors 14 to a voltage and/or current signal. Additional circuitry on the chip may be included to amplify the voltage, and/or convert it to digital data. BSI image sensors of this type are well known in the art, and not further described herein.

Figure 1B:
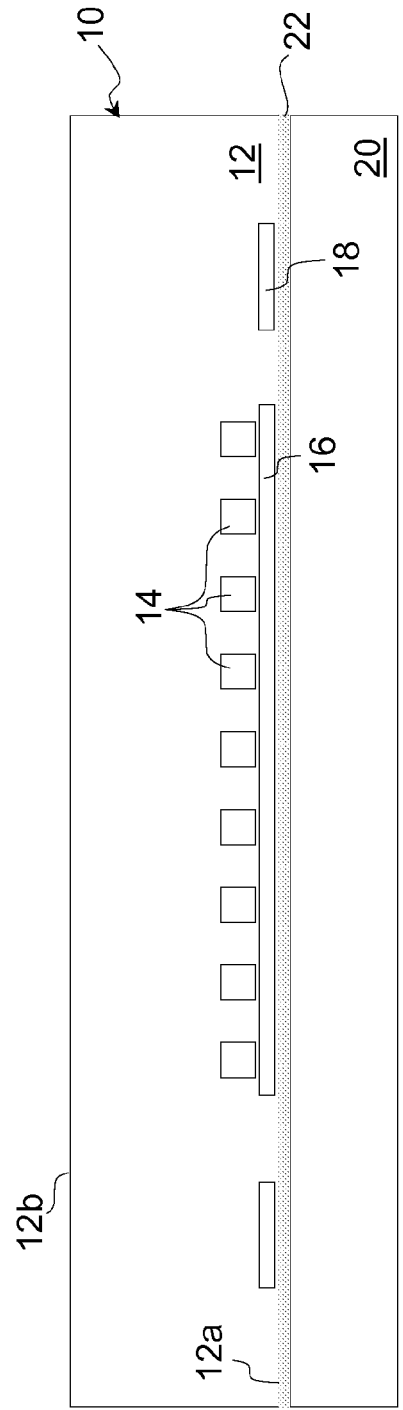

A handler 20 is affixed to the front surface 12a of substrate 12 using a bonding interface 22. Handler 20 may be made of ceramic or crystalline material. Bonding interface 22 can be, for example, silicon dioxide, epoxy composites, polyamide or any other dielectric material that can withstand temperatures up to 200° C. An optional thinning process can then be used to reduce the thicknesses of substrate 12 and handler 20 (i.e. by grinding or etching back surface 12b of substrate 12 and the bottom surface of handler 20). In a preferred embodiment, the substrate 12 would preferably have a thickness equal to or greater than 10 µm and the remaining handler 20 would preferably have a thickness equal to or greater than 50 µm. The resulting structure is shown in FIG. 1B.

Figure 1C:
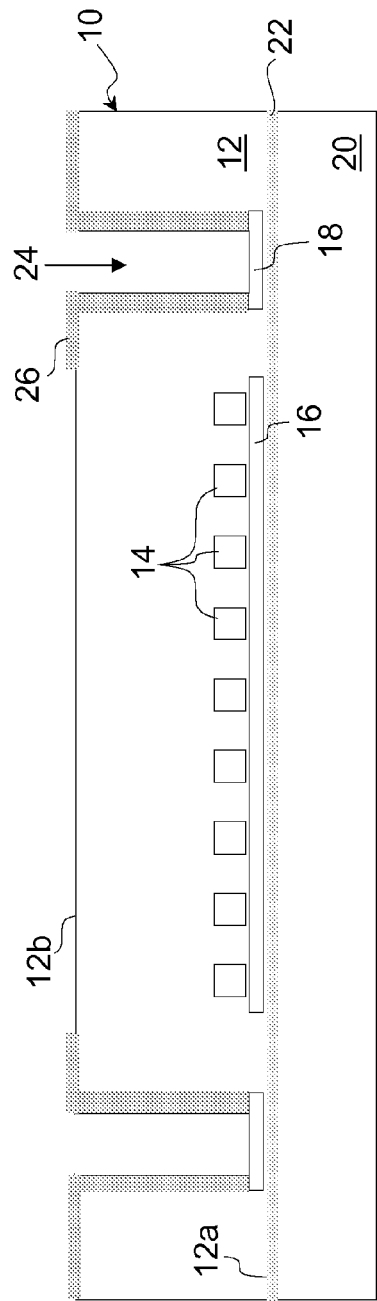

Holes 24 (i.e. vias) are then formed into the back surface 12b that extend down to and expose contact pads 18. Holes 24 can be formed by the use of a laser, a plasma etching process, a sandblasting process, a mechanical milling process, or any other similar method. Preferably holes 24 are formed by photo-lithography plasma etching, which includes forming a layer of photo resist on the back surface 12b of substrate 12, patterning the photo resist layer to expose selected portions of surface 12b, and then performing a plasma etch process (e.g. BOSCH process, which uses combination of SF6 and C4F8 gases) to remove the exposed portions of substrate 12 until contact pads 18 are exposed at the bottoms of the holes. An isolation (dielectric) layer 26 is then deposited/formed and patterned on the back surface 12b (including the side walls of holes 24). Layer 26 can be Si oxide, Si nitride, epoxy based, polyimide, resin or any other appropriate dielectric material(s). Preferably, dielectric layer 26 is $SiO_2$ with at least a 0.5 µm thickness, which is formed by using of a PECVD deposition technique (which is well known in the art), followed by lithography process that removes the dielectric material from select portions of surface 12b and the bottoms of holes 24. The resulting structure is shown in FIG. 1C.

Figure 1D:
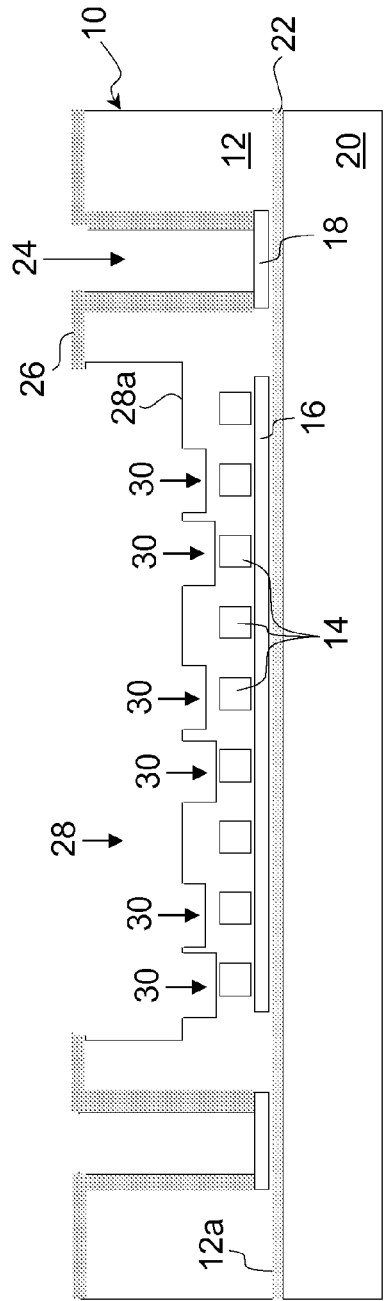

A cavity 28 is then formed into that portion of the surface 12b over photo detectors 14. Cavity 28 can be formed by the use of a laser, a plasma etching process, a sandblasting process, a mechanical milling process, or any other similar method. Preferably cavity 28 is formed by photo-lithography plasma etching which leaves a minimum thickness at the maximum depth portion of the cavity of around 10 µm (i.e. cavity 28 has a bottom surface 28a around 10 µm from front surface 12a). Alternately, the plasma etching process can be performed without a photo-lithography step by using dielectric layer 26 as the selective mechanism (i.e. the gap in dielectric layer 26 on surface 12b defines those portions of substrate 12 exposed to and subject to the plasma etch). Secondary cavities 30 are then formed into selected portions of the bottom surface 28a of cavity 28, preferably by one or more lithography and plasma etching processes or any other similar methods. Each of the secondary cavities 30 is disposed over one or more of the photo-detectors 14. The depth of each secondary cavity 30 will vary depending upon the color of light that the corresponding photo-detector 14 underneath will be measuring. As a non-limiting example, in the case of RGB photo detectors, secondary cavities 30 having a depth of 5 to 6 µm are formed over the red light photo detectors (i.e. those associated with a red filter described below), secondary cavities 30 having a depth of 1.5 to 2 µm are formed over the green light photo detectors (i.e. those associated with a green filter described below), and no secondary cavities are formed over the blue light photo detectors (i.e. those associated with a blue filter described below). The resulting structure is shown in FIG. 1D.

Figure 1E:
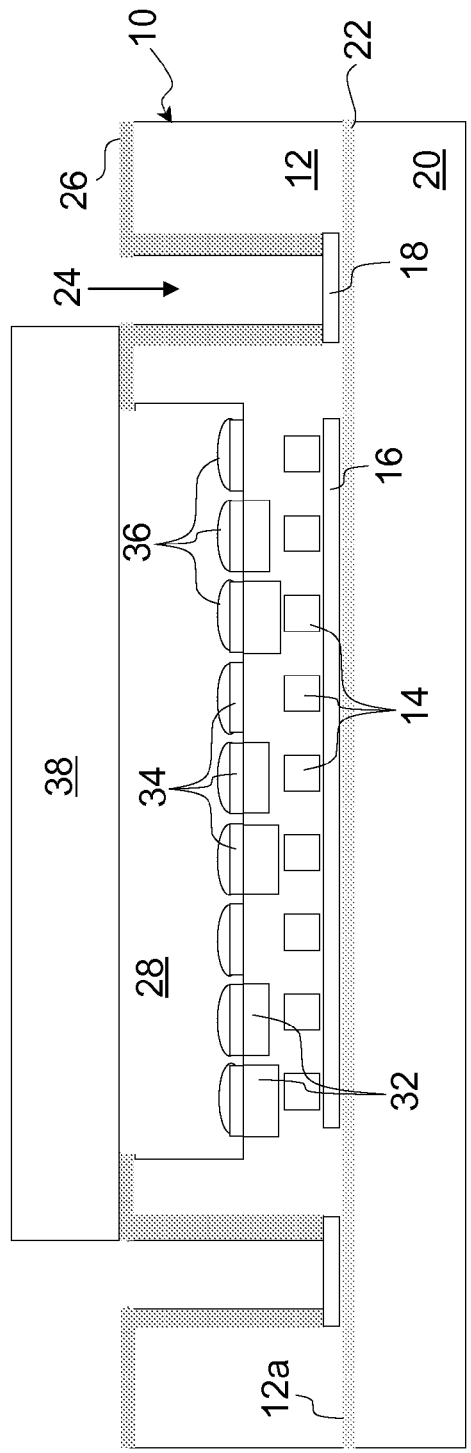

An absorption compensation material 32 is deposited inside secondary cavities 30. Material 32 can be any material that has light absorption characteristics that differ from those of silicon substrate 12 (e.g. absorption coefficients at various frequencies that differ from those of silicon). Material 32 can be a polymer, epoxy based, a resin or any other appropriate material(s) with the desired light absorption characteristics. Preferably, material 32 is polymer which is formed by using a spray deposition technique (which is well known in the art), followed by lithography removal process such that the secondary cavities 30 are filled with the material 32 (i.e. up to the bottom surface 28a of cavity 28). A color filter 34 and microlens 36 are mounted inside cavity 28 over each photo detector 14 (i.e. over each filled secondary cavity 30) using conventional filter/lens manufacturing processes (which are well known in the art). The microlenses 36 can be separate from each other or integrally formed together. Similarly, adjacent color filters 34 for the same color can be separate from each other or integrally formed together. An optional anti-reflective coating may be applied to or included on microlenses 36, or between color filter 34 and either material 32 or surface 28a. An optically transparent substrate (e.g. glass) 38 is then bonded on or over the substrate back surface 12b (i.e. over cavity 28) using a joining interface (not shown) such as polyimide, resin, epoxy based or any other appropriate joining material(s). Optical transparency means that at least one range of light wavelengths can pass through the substrate 38 with at most only tolerable absorption losses for the desired wavelengths. The resulting structure is shown in FIG. 1E.

Figure 1F:
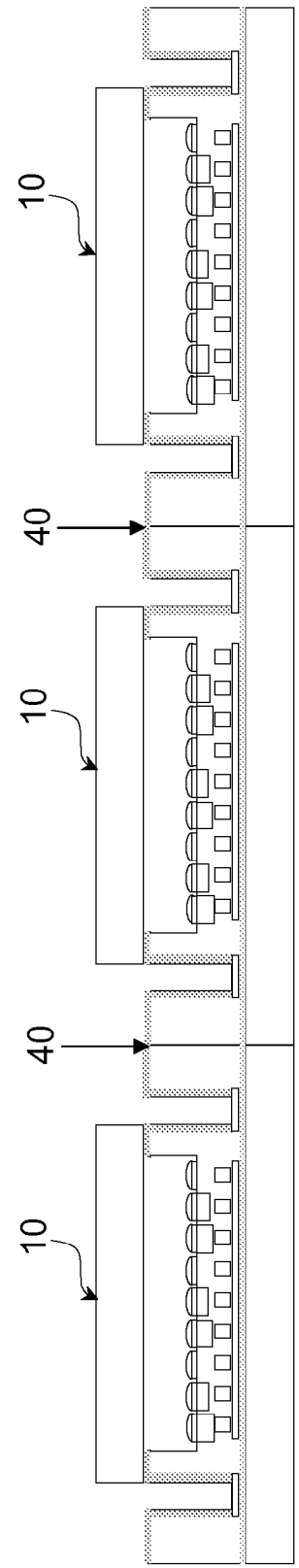

Preferably, multiple image sensor chips are fabricated as individual die on a single wafer. At this stage of processing, the wafer level assembled structures are separated (i.e. diced, singulated, etc.) to form the individual packages. This procedure can be completed by use of conventional wafer dicing and/or laser equipment, which separates the individual die along die lines 40, as shown in FIG. 1F. The die can be tested either before or after dicing, and known good sensor chips are then removed and placed in the trays for future assembly.

The known good image sensor chip 10 is next attached to a host board (e.g. a printed circuit board) 42 which includes contact pads 44 and electrical traces (not shown) for off chip signaling. Wires 46 are connected between (and provide an electrical connection between) the contact pads 18 of the image sensor chip 10 and the respective contact pads 44 of host board 42. Wires 46 can be alloyed gold, copper or any other appropriate wire bonding material, and are formed by using any conventional wire bonding technique (which are well known in the art). A lens module assembly 48 is then affixed or assembled over the optically transparent substrate 38, preferably using a joining material such as epoxy. The lens module assembly 48 includes one or more lenses 50 (for focusing light onto the photo detectors 14) and a transparent substrate 52 over the lens(es) 50. The final structure is illustrated in FIG. 1G.

In operation, incident light is focused by lens module 48, through substrate 38, through microlenses 36 and color filters 34, through material 32 (if any), through any of the substrate 12 and into photo detectors 14, which in turn provide electrical signals in response to the incident light. The electrical signals are processed by supporting circuitry 16, and transferred off-chip via contact pads 18, wires 46, and contact pads 44.

Figure 1G:
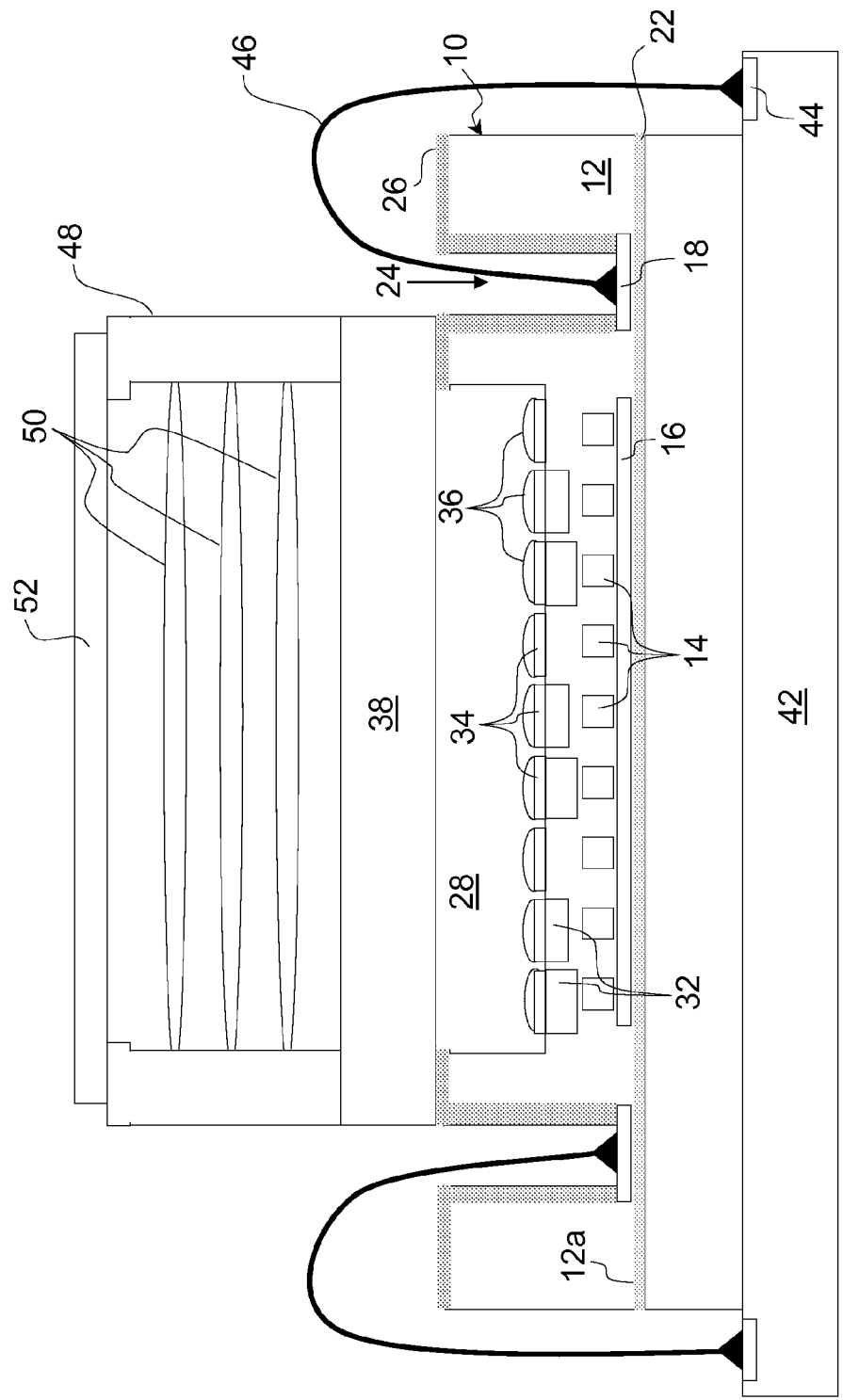

The main advantage of the package structure of FIG. 1G is that the varying depths of material 32 (which can be accurately controlled) disposed over the photo detectors 14 result in substantially the same absorption for all colors of light. For example, assuming the material 32 has higher absorption coefficients than silicon, then the thickness of material 32 over the red pixel photo detectors 14 (i.e. those photo detectors 14 with a red color filter 34) would be the greatest, the thickness of material 32 over the green pixel photo detectors (i.e. those photo detectors 14 with a green color filter 34) would be less than that for the red pixel photo detectors, and the thickness of the material 32 over the blue pixel photo detectors (i.e. those photo detectors 14 with a blue color filter 34) would be the least of the three or even zero (i.e. no material 32 over the blue pixel photo detectors because no secondary cavities 30 were formed over these photo detectors). With this configuration, all three colors of light would be equally or near equally attenuated as they pass through the silicon substrate 10 and any material 32 because the increased depths of material 32 would attenuate the red and green light to match the intensity of blue light reaching the photo detectors. Suitable materials 32 having absorption coefficients higher than silicon include organic and inorganic polymers or semiconductor doping materials.

As another example, assuming the material 32 has lower absorption coefficients than silicon, then the thickness of material 32 over the blue pixel photo detectors 14 would be the greatest, the thickness of material 32 over the green pixel photo detectors would be less than that for the blue pixel photo detectors, and the thickness of the material 32 over the red pixel photo detectors would be the least of the three or even zero (i.e. no material 32 over the red pixel photo detectors because no secondary cavities 30 were formed over these photo detectors). With this configuration, all three colors of light would be equally or near equally attenuated as they pass through the silicon substrate 10 and any material 32. Materials 32 having absorption coefficients lower than silicon include organic and inorganic polymers.

Another advantage of the package structure of FIG. 1G is that each component can be separately fabricated and tested. Specifically, each image sensor chip 10 can be tested and verified before being affixed to board 42 and packaged with lens module assembly 48 (which are also fabricated and tested separately) so that only known good components preferably make it to final integration, thus increasing yield and pass rates, and decreasing costs. The package structure also has a low profile, provides the requisite mechanical support and electrical connectivity, and thus is more reliable and cost effective.

Figure 2A:
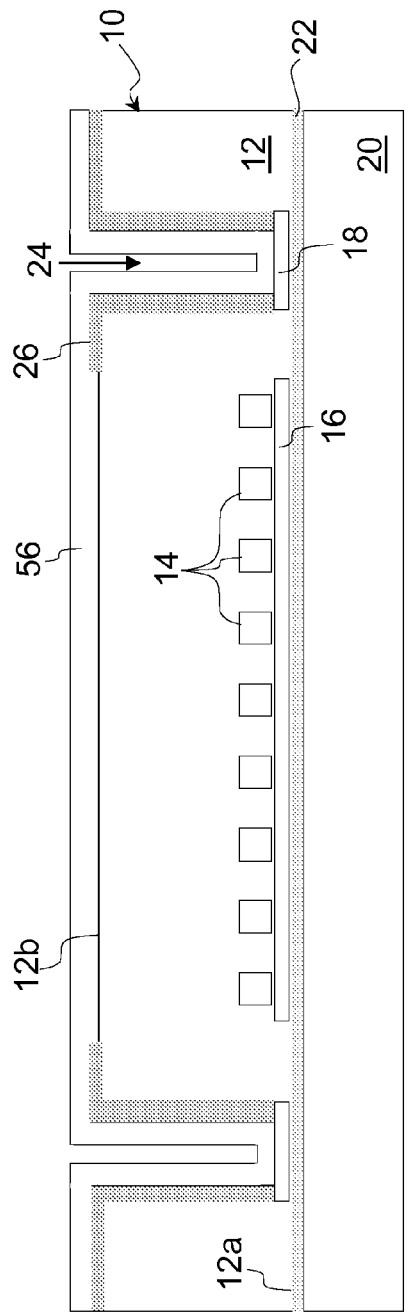
FIGS. 2A-2E are cross sectional side views showing in sequence the steps in forming an alternate embodiment of the packaged image sensor.
Figure 2B:
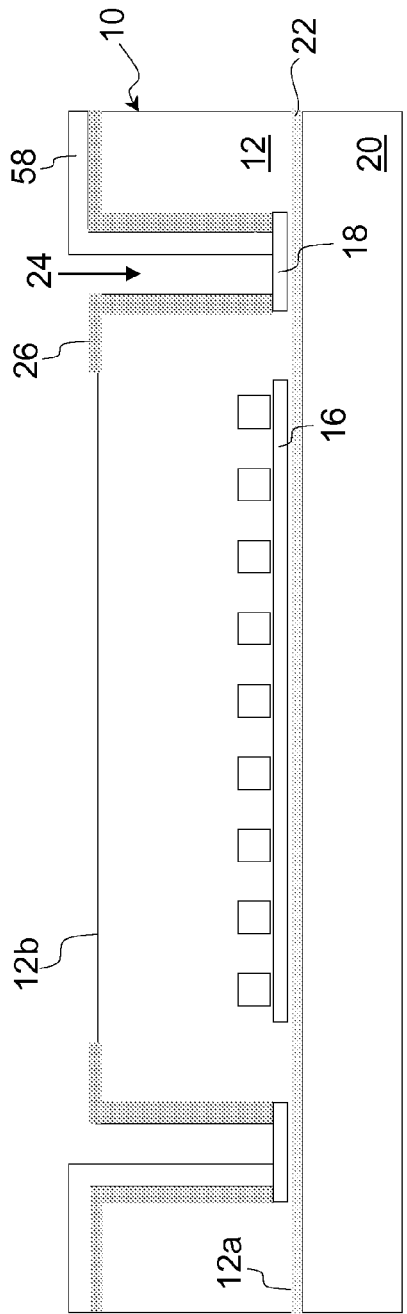

FIGS. 2A-2E illustrate the fabrication of an alternate embodiment of the packaged image sensor. Starting with the structure illustrated in FIG. 1C, a layer of conductive material 56 is deposited over the structure, including on the side and bottom walls of holes 24, as illustrated in FIG. 2A. Conductive layer 56 can be Cu, Ti/Cu, Ti/Al, Cr/Cu or other well-known conductive material(s). Deposition can be done by sputtering, plating or a combination of sputtering and plating. A patterned photo-lithography layer is deposited on top of conductive layer 56, followed by an etch process to remove selected portions of layer 56, leaving a plurality of conductive traces 58 each extending from contact pad 18 (at the bottom of hole 24), up the hole sidewall, and along substrate back surface 12b. The resulting structure is shown in FIG. 2B.

Figure 2C:
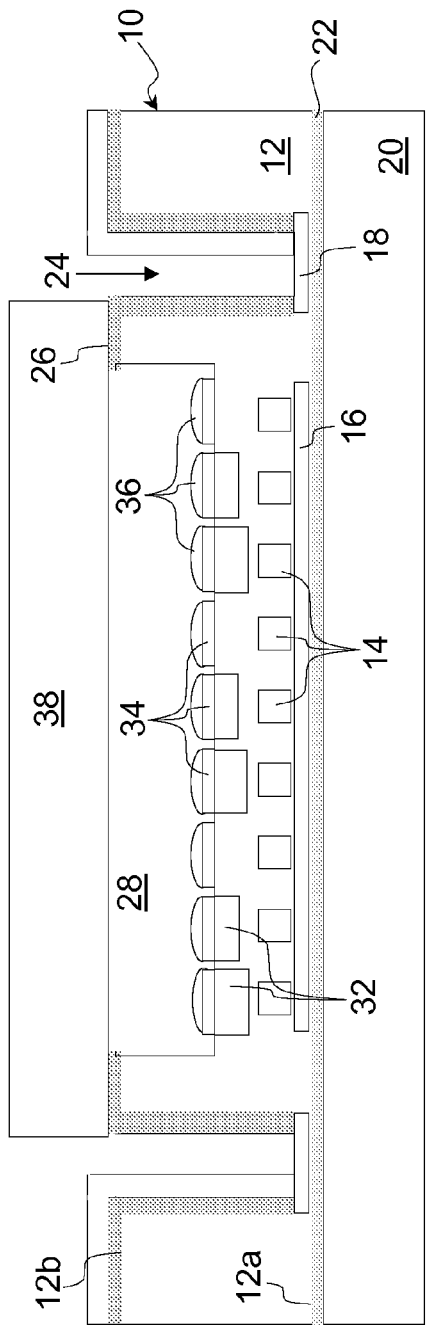
Figure 2D:
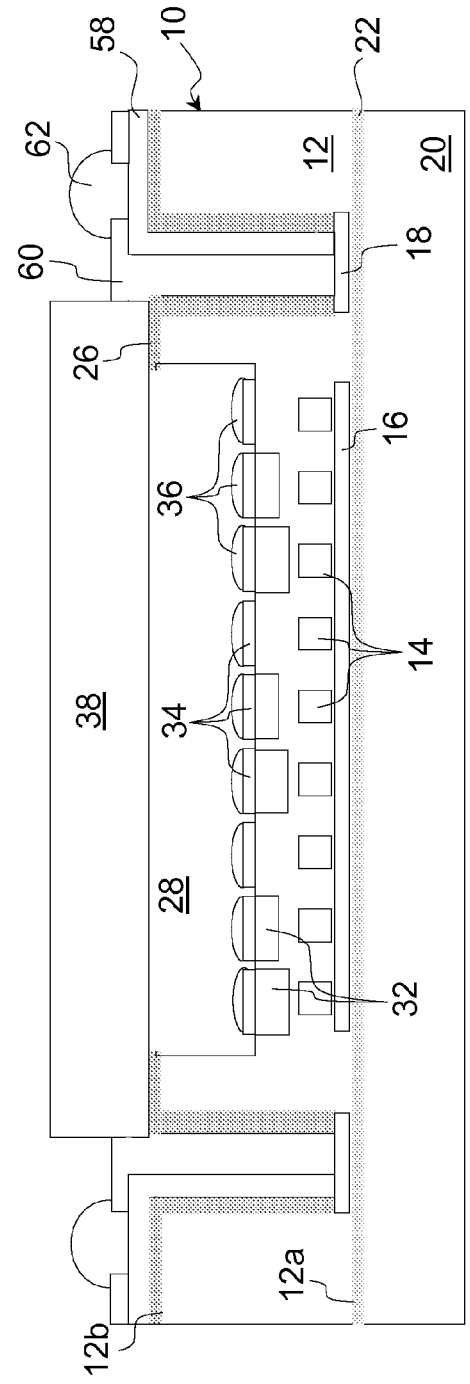

The formation of cavity 28, secondary cavities 30, material 32, color filters and microlenses 34/36, and transparent substrate 38 are performed in a similar manner as that explained above with respect to FIGS. 1D-1E, resulting in the structure shown in FIG. 2C. A patterned encapsulation (dielectric) material is then formed on the back side of image sensor wafer by material deposition followed by selective removal via lithography, which leaves encapsulation material 60 disposed over substrate back surface 12b and preferably filling holes 24. The encapsulant material 60 is also removed on selected portions of back surface 12b leaving selected portions of traces 58 exposed. Encapsulant material 60 is a dielectric material that can be epoxy based, polyimide, resin or any other appropriate insulation material(s). Preferably, encapsulant material 60 on back surface 12b is 5 µm to 40 µm in thickness, and fully encapsulates holes 24. SMT (surface mount) interconnects 62 are next formed over back surface 12b in a manner such that each is in electrical contact with the exposed portion of one of the traces 58. SMT interconnects 62 can be BGA type, and formed using a screen printing process of a solder alloy, or by a ball placement process, or by a plating process. BGA (Ball Grid Array) interconnects are rounded conductors for making physical and electrical contact with counterpart conductors, usually formed by soldering or partially melting metallic balls onto traces 58. Alternately SMT interconnects 62 can be conductive metal posts (e.g. copper). The resulting structure is illustrated in FIG. 2D.

Figure 2E:
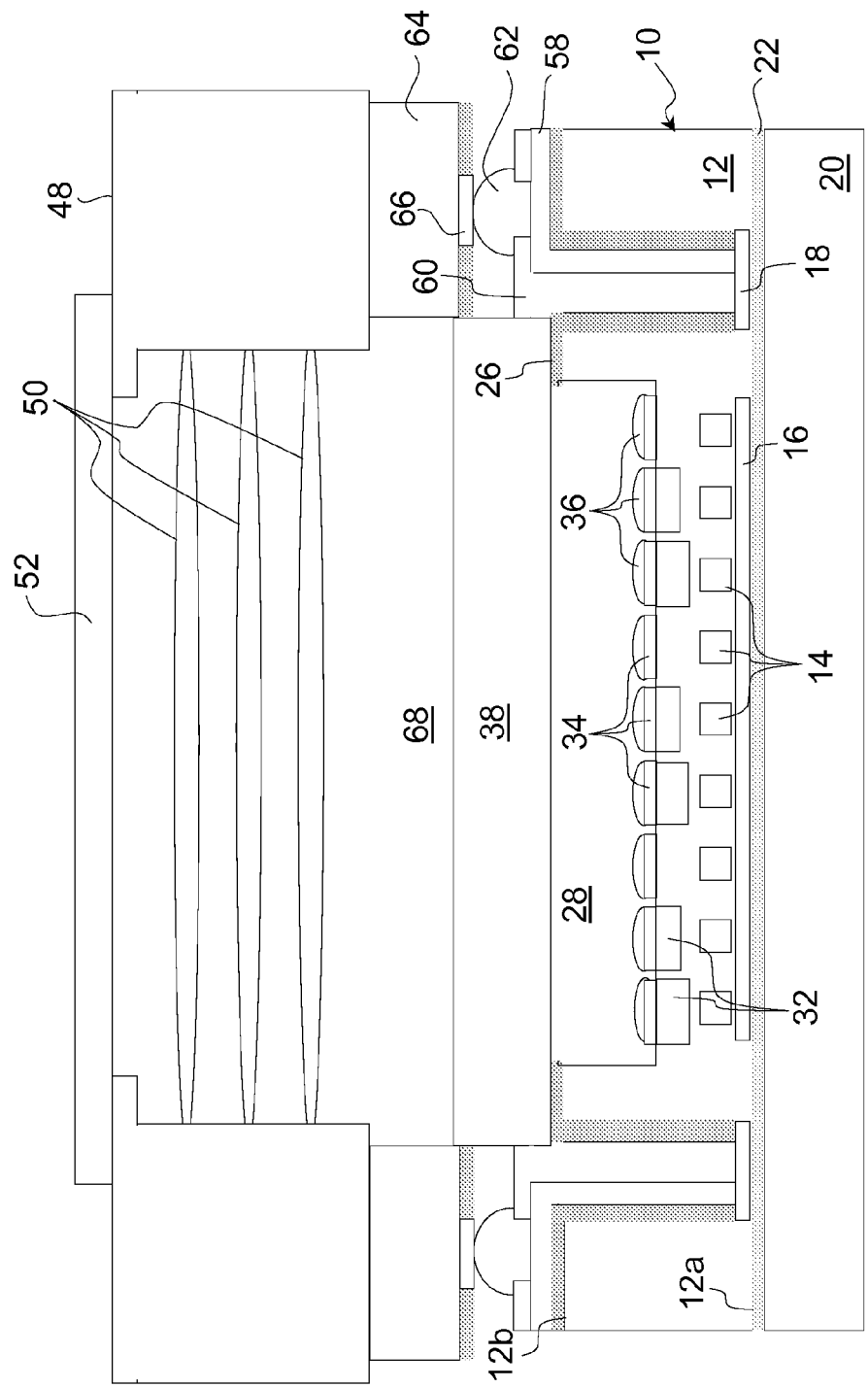

After wafer dicing/singulation in a similar manner as discussed above with respect to FIG. 1F, the image sensor chip 10 is attached to a host board 64. Host board 64 includes electrical traces (not shown) with contact pads 66 that electrically connect to SMT interconnects 62 using conventional SMT or flip chip assembly techniques. Host board 64 includes an aperture 68 disposed over the photo detectors 14 through which the incident light passes. The lens module assembly 48 attaches to the host board such that the lens(es) 50 focus the incident light though aperture 68, through transparent substrate 38, through microlenses/color filters 36/34, through material 32 (if any), through silicon substrate 12, to photo detectors 14. The final structure is shown in FIG. 2E. The electrical signals from the photo detectors 14 are processed by supporting circuitry 16, and transferred off-chip via contact pads 18, traces 58, SMT interconnect 62, and contact pad 66 and traces on the host board 64.

Figure 3C:
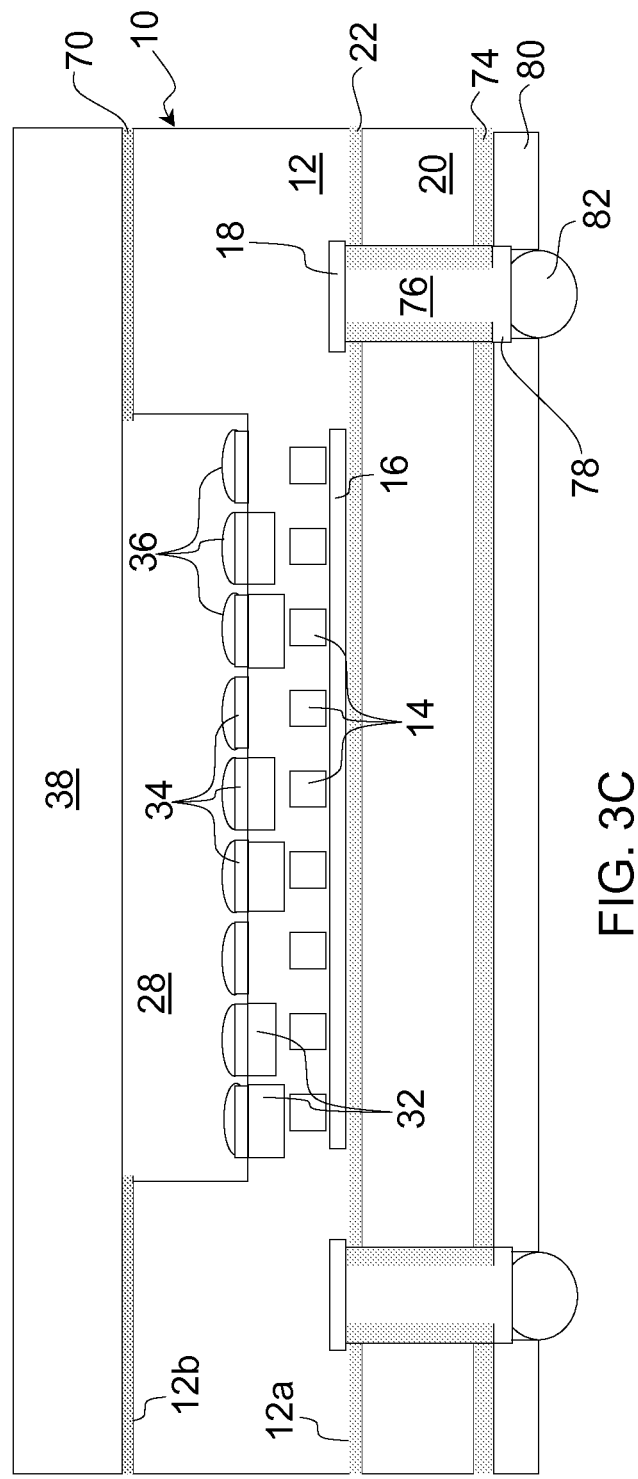

FIGS. 3A-3D illustrate the fabrication of a second alternate embodiment of the packaged image sensor. The beginning structure is that shown in FIG. 1E, except without the formation of holes 24 and dielectric layer 26 (as illustrated in FIG. 3A—which instead shows the joining interface material 70 between the transparent substrate 38 and the substrate 12). Holes 70 are formed through handler 20 to expose contact pads 18. Holes 70 can be formed by the use of a laser, a plasma etching process, a sandblasting process, a mechanical milling process, or any other similar method. Preferably holes 70 are formed by photo-lithography plasma etching, which includes forming a layer of photo resist on the handler, patterning the photo resist layer to expose select portions of permanent handler, and then performing a plasma etch process (e.g. BOSCH process, which uses combination of SF6 and C4F8 gases) to remove the exposed portions of the handler 20 to form holes 72. An isolation (dielectric) layer 74 is deposited and patterned on the bottom surface of handler 20 (including inside holes 72). Layer 74 can be Si oxide, Si nitride, epoxy based, polyimide, resin or any other appropriate dielectric material(s). Preferably, dielectric layer is $SiO_2$ with a thickness at least 0.5 µm, which is formed by using a PECVD deposition technique (which is well known in the art), followed by a lithography process that removes the dielectric layer from the bottoms of holes 72 (to leave contact pads 18 exposed). The resulting structure is shown in FIG. 3B.

A conductive material 76 is deposited on the dielectric layer 74, preferably partially or fully filling holes 72. The conductive material can be Cu, Ti/Cu, Ti/Al, Cr/Cu or other well-known conductive material(s). Deposition can be by sputtering, plating or a combination of sputtering and plating. A photo-lithography etch process is then used to selectively remove conductive material 76 except for inside holes 72 (and preferably a small portion extending out of holes 72 that form SMT compatible pads 78). A patterned encapsulation (dielectric) layer 80 is then deposited on the bottom surface of handler 20, which can be epoxy based, polyimide, Fr4, resin or any other appropriate encapsulant material(s). Preferably, encapsulation layer 80 has a thickness of around 5 µm to 40 µm. Encapsulation layer 80 can be formed using any standard capsulation deposition processes (which are well known in the art). A photolithography process is then used to remove portions of the encapsulation layer 80 to expose SMT compatible pads 78. SMT interconnects 82 are then formed on the exposed pads 78 in a similar manner as described above with respect to SMT interconnects 62. The resulting structure is shown in FIG. 3C.

Figure 3D:
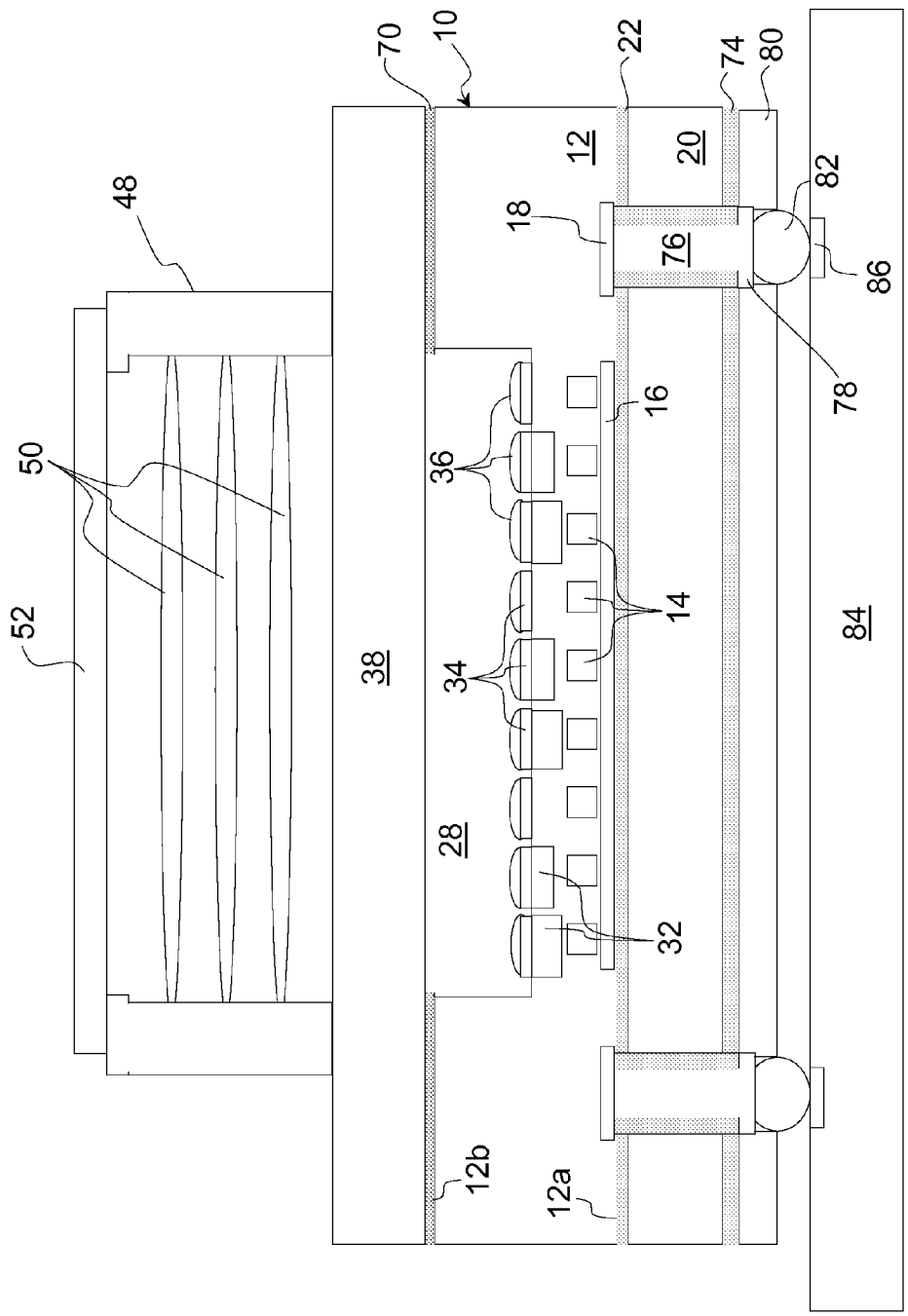

After wafer dicing/singulation in a similar manner as discussed above with respect to FIG. 1F, the lens module assembly 48 is attached to transparent substrate 38 such that the lens(es) 50 focus the incident light though transparent substrate 38, through microlenses/color filters 36/34, through material 32 (if any), through silicon substrate 12, and to photo detectors 14. The image sensor chip 10 is then attached to a host board (e.g. a printed circuit board) 84 which includes contact pads 86 and electrical traces (not shown) for off chip signaling. The final structure is shown in FIG. 3D. The electrical signals from the photo detectors 14 are processed by supporting circuitry 16, and transferred off-chip via contact pads 18, conductive material 76, contact pads 78, SMT interconnects 80 and contact pads 86 and traces of host board 84.

Figure 4:
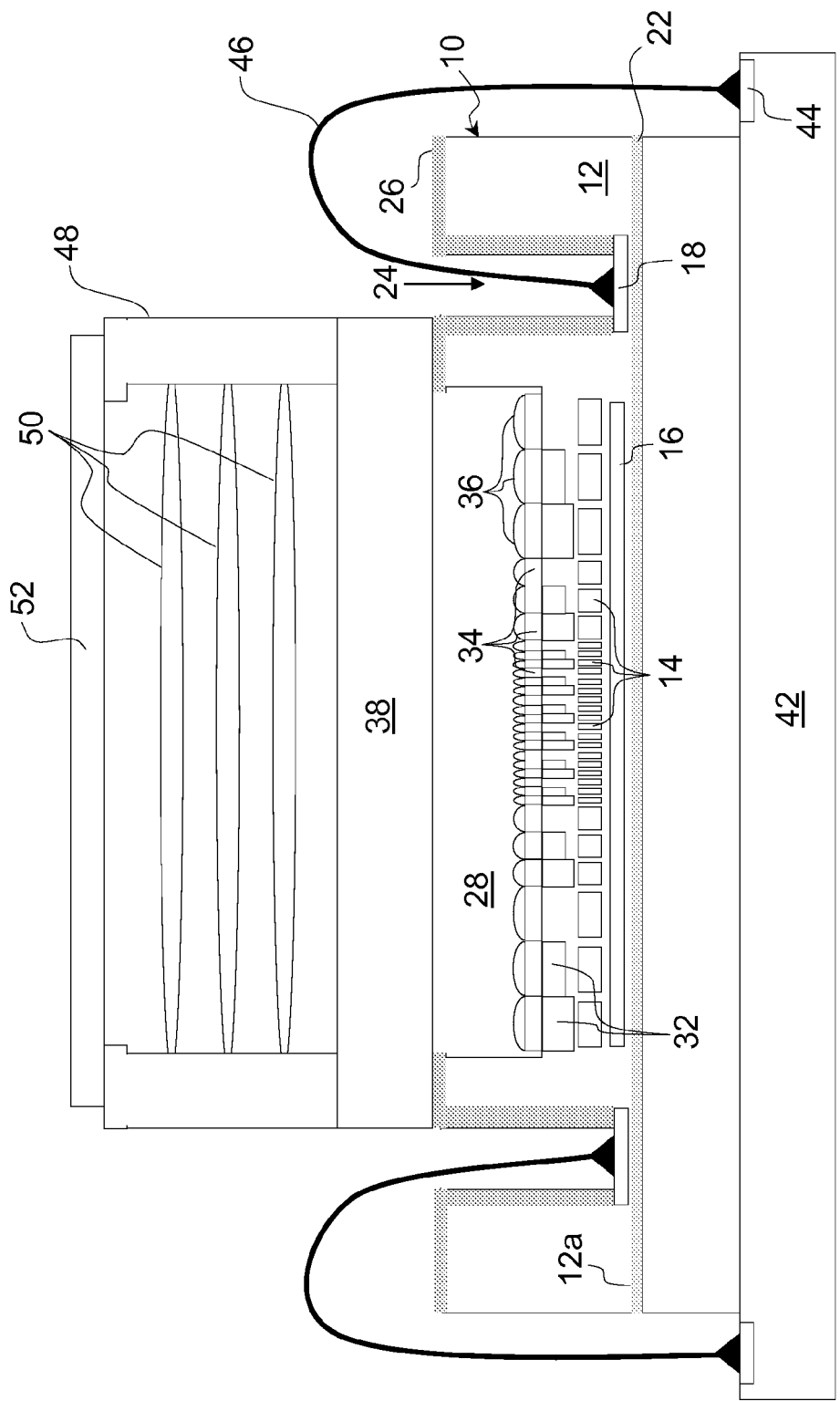
FIG. 4 is a cross sectional side view showing an alternate embodiment of the packaged image sensor of FIG. 1G, in which the sizes of photo detectors is varied within the image sensor array.
Figure 5:
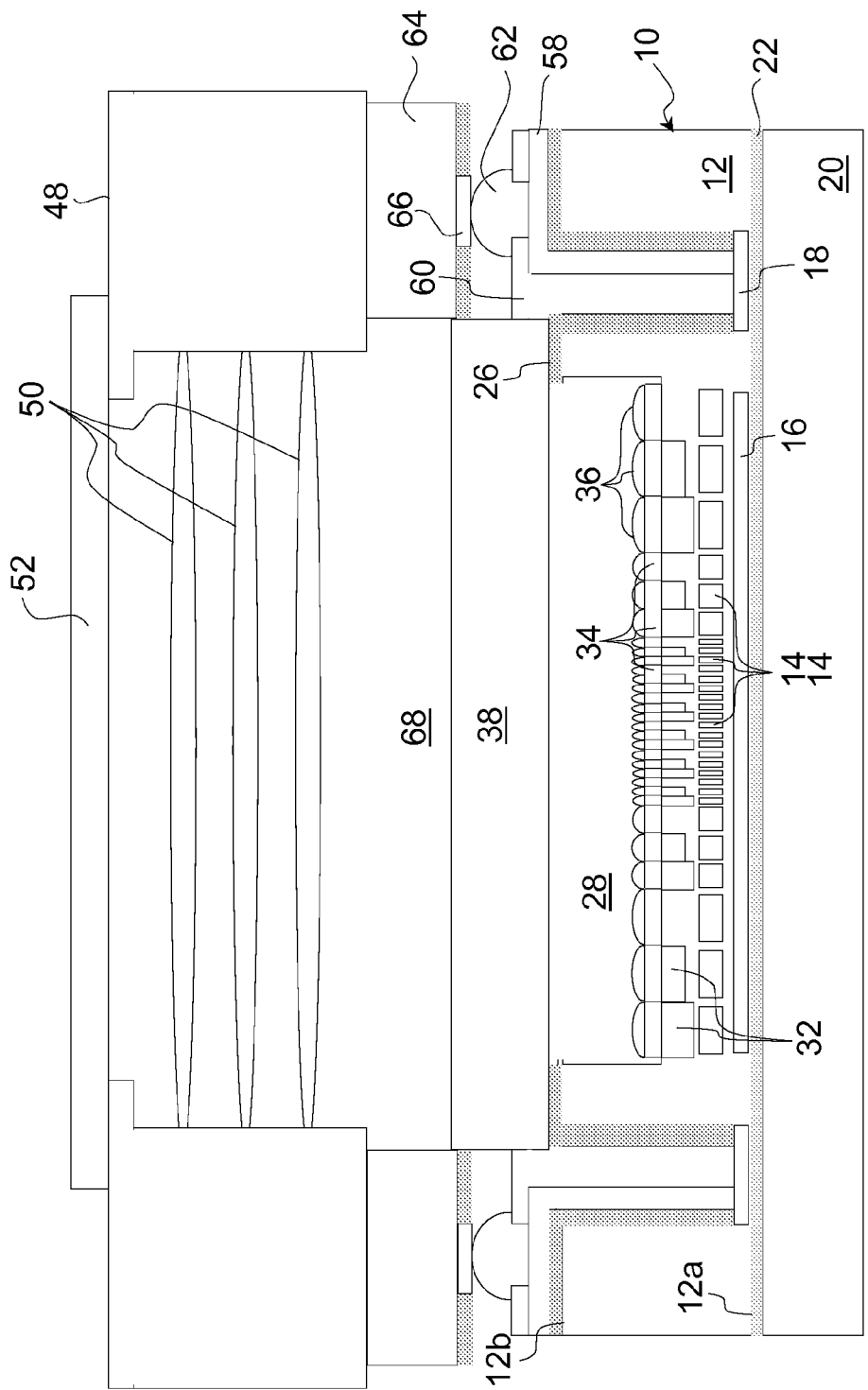
FIG. 5 is a cross sectional side view showing an alternate embodiment of the packaged image sensor of FIG. 2E, in which the sizes of photo detectors is varied within the image sensor array.
Figure 6:
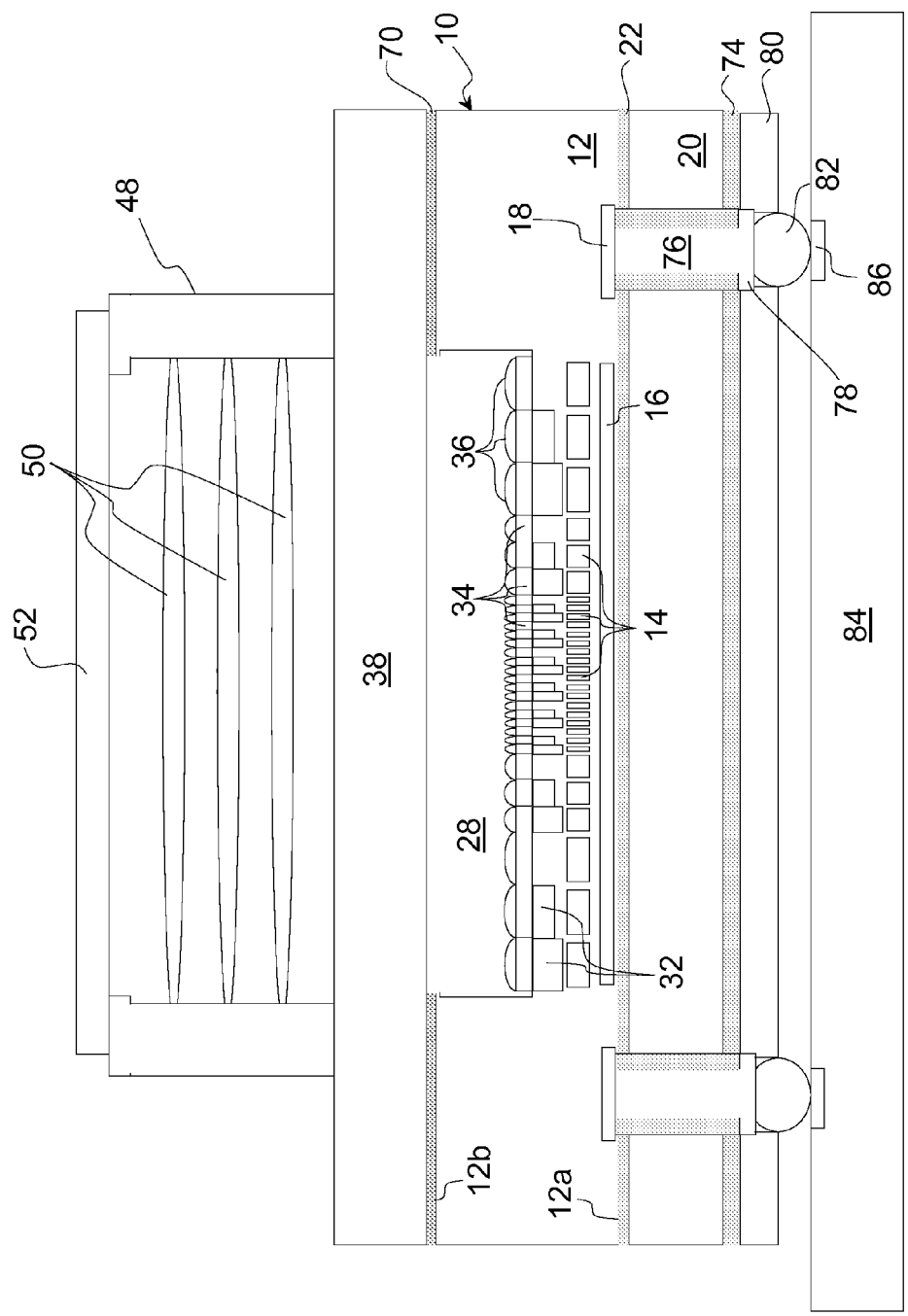
FIG. 6 is a cross sectional side view showing an alternate embodiment of the packaged image sensor of FIG. 3D, in which the sizes of photo detectors is varied within the image sensor array.

FIGS. 4-6 illustrate alternate embodiments of the packaged image sensor assemblies of FIGS. 1G, 2E and 3D, respectively. In each case, the two-dimensional density of photo detectors 14 (and their associated color filters 34, microlenses 36 and any absorption material 32) is greatest at a central portion of the array of photo detectors 14, and decreases at the periphery of the array of photo detectors 14, as illustrated in FIGS. 4-6. The density decrease away from the center of the device can be accomplished by increasing the lateral cross-sectional area of each photo detector 14 (along with the cross-sectional area of the corresponding color filter 34, microlens 36 and any absorption material 32) as a function distance from a central point or area of the device. Preferably the spacings between photo detectors remains substantially constant and as small as possible (possibly even zero), to minimize the amount of light that hits the spacings and thus not be sensed by any photo detectors.

Figure 7A:
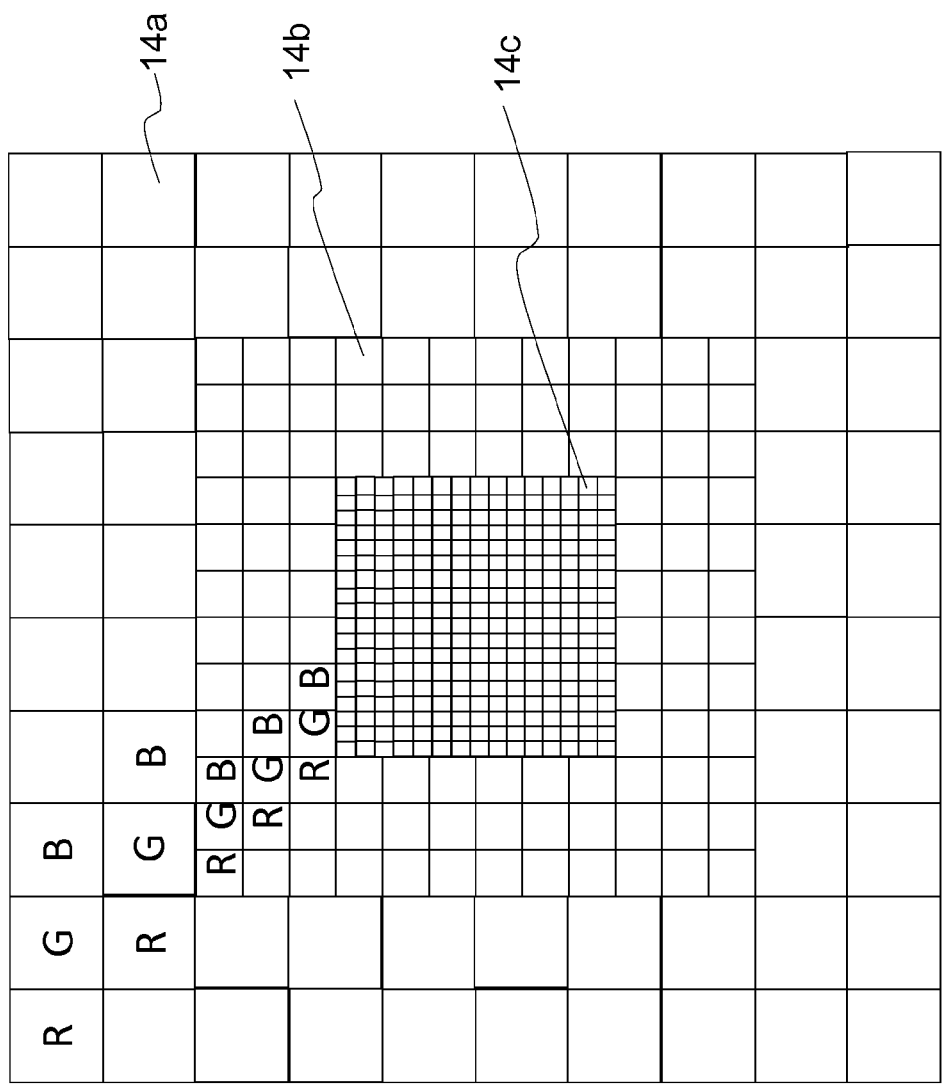
FIGS. 7A and 7B are diagrams illustrating one exemplary scheme for the changing relative sizes and layout of the photo detectors within the image sensor array.
Figure 7B:
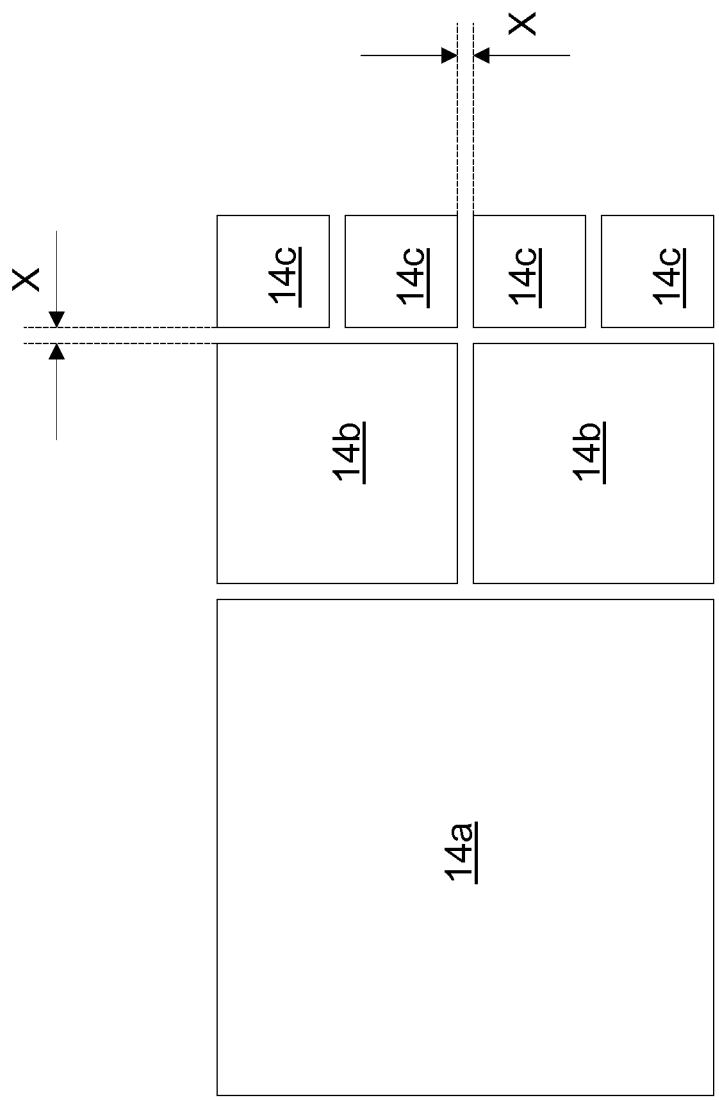

The scaling factor dictating the increase of the lateral size of the photo detectors can be continuous and gradual, involve discreet size reduction steps for groups of photo detectors, or any combination thereof. For example, FIG. 7A illustrates an array of photo detectors having three lateral sizes. Photo detectors 14a near the periphery of the array have the largest lateral size. Photo detectors 14c at the center of the array have the smallest lateral size. Photo detectors 14b, which are between photo detectors 14a and 14c, have a medium lateral size. As a non-limiting example, the scaling factor for the array of FIG. 7A can follow the equations below and is illustrated in FIG. 7B:

$$A = 2B + X = 4C + 3X \quad (1)$$

$$B = 2C + X \quad (2)$$

where A is the size of photo detectors 14a, B is the size of photo detectors 14b, C is the size of photo detectors 14c, and X is the distance between photo detectors (where X≥0). Each step down in lateral size (e.g. from A to B, or from B to C) preferably (but not necessarily) involves a reduction in lateral size by half or roughly half in order to simplify the processing of the signals from the photo detectors (e.g. image processing can consider multiple smaller photo detectors as a single pixel relative to a larger photo detector also considered a single pixel) and to minimize gaps between the photo detectors. While only three lateral photo detector sizes are shown and described above, additional lateral photo detector sizes can be utilized.

The increased lateral size of the photo detectors at the periphery of the sensor device reduces cross talk between those photo detectors nearer the periphery of the image sensor, and substantially increases the quantum efficiency of the sensor device.

Figure 8:
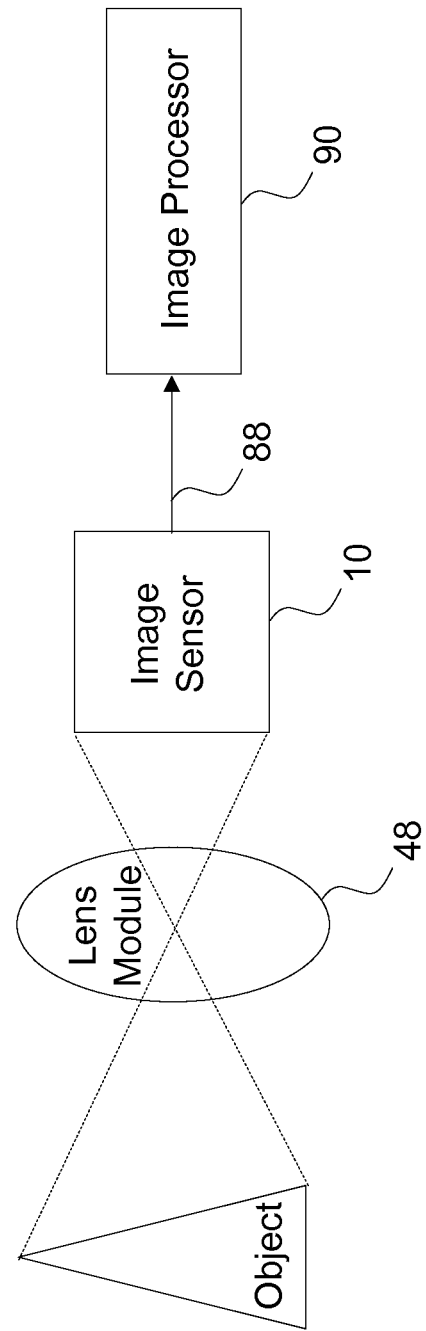
FIG. 8 is a diagram illustrating the capture of an image by the image sensor, and the sending of signals from the image sensor to the image processor.

The higher concentration of pixels at the center of the array can also be used to implement a zoom function with a fixed focus lens and post processing, which can reduce the height of the device by twenty five percent or more by eliminating a moving lens assembly. As shown in FIG. 8, the image sensor 10 captures an image of an object through lens module 48, generates an image signal 88, and sends the image signal 88 to an image processor 90. To create a zoom image of the center of the captured image, the image processor effectively crops down the image by only considering the signals from the centrally located photo detectors 14 (using a boundary having the same aspect ratio as the original and disregarding the signals from the photo detectors 14 outside the boundary—i.e. nearer the periphery), and then interpolating those signals from the more centrally located photo detectors back to the pixel dimensions of the original image. The quality of zoomed image is practically limited to the density or number of active pixels within that boundary.

Figure 9B:
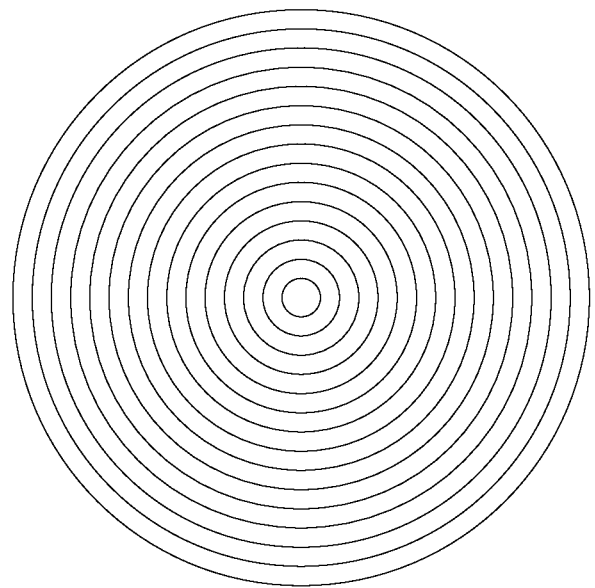
FIGS. 9B and 10B are diagrams illustrating a lens with a uniform magnification factor.
Figure 9A:
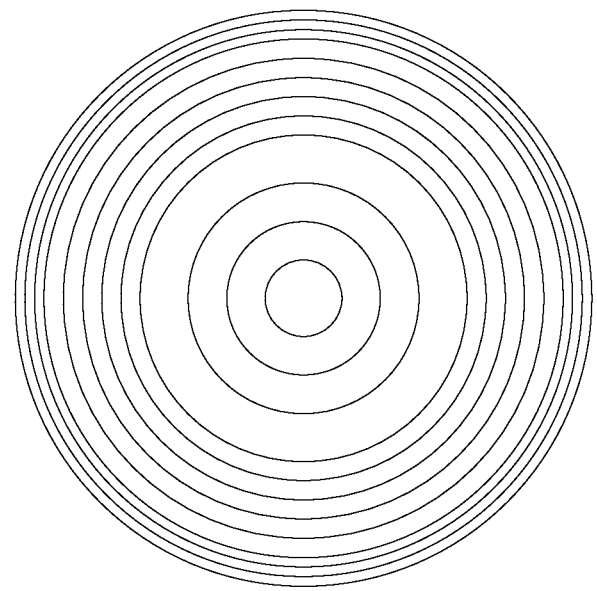
FIGS. 9A and 10A are diagrams illustrating a lens with a non-uniform magnification factor.
Figure 10B:
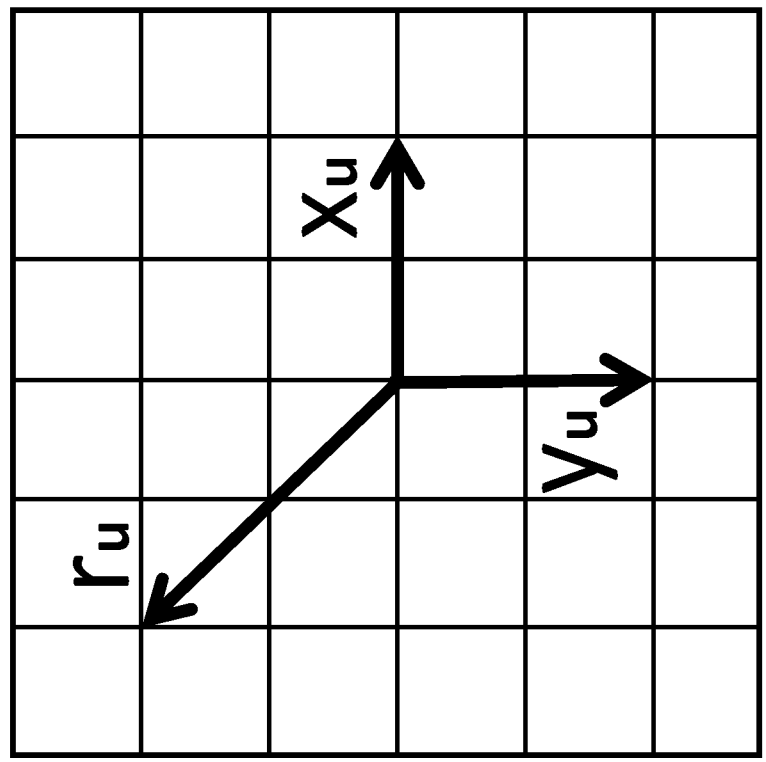
Figure 10A:
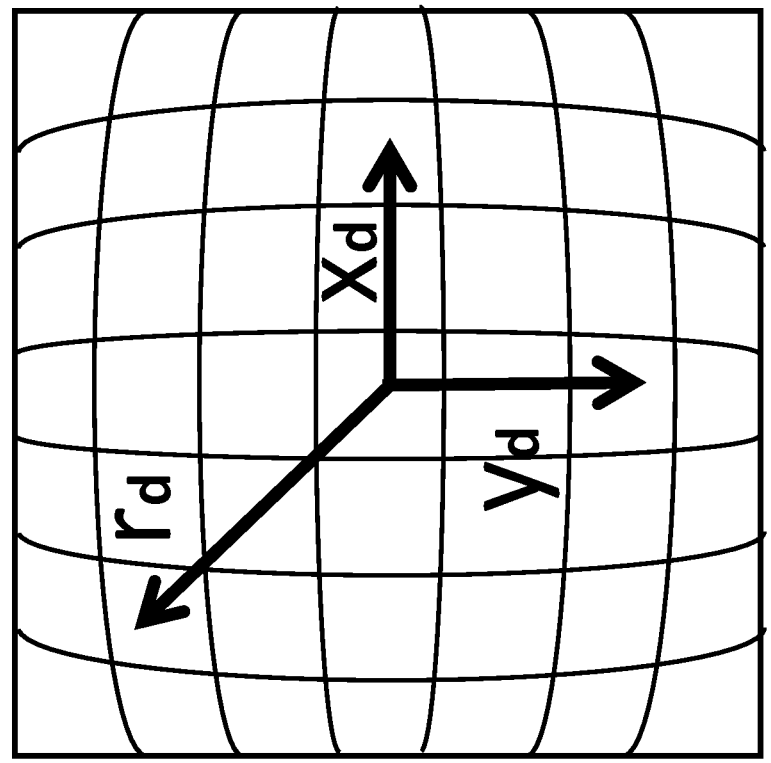

In order to realize larger magnifications, the lens module 48 can have a larger magnification factor in the center of field of view (FOV) as illustrated in FIGS. 9A and 10A, as compared to a uniform magnification as illustrated in FIGS. 9B and 10B. Such a lens configuration will create distorted image in which the center part is distorted and greater number of pixels may be used to describe the zoomed image. The Barrel distortion algorithm $r_u = r_d(1 + kr_d^2)$ is an equation for finding the undistorted position of a distorted pixel. The distorted pixel would be moved to the calculated location, thus eliminating the barrel distortion effect (see FIGS. 9B and 10B). An undistorted pixel location is represented by $r_u$, the distance between the distorted pixel and optical axis is represented by $r_d$, and the distortion parameter that is unique to each lens is represented by k. Generated coordinates are not always an integer value. Therefore, placing undistorted pixels in-between the original pixels, and using bilinear interpolation, addresses this issue. Bilinear interpolation involves sampling four of the nearest neighbor pixels, and using their weighted sum to creating a new pixel which closely resembles its surroundings.

Figure 11:
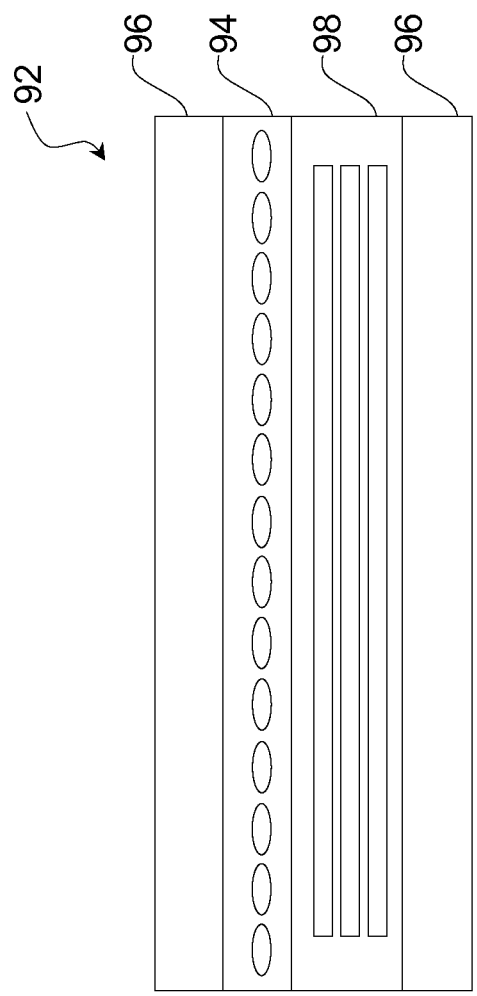
FIG. 11 is a cross sectional side view showing the layers of a liquid crystal lens.

The zoom function can alternately be enhanced by using a liquid crystal lens 92, where the liquid crystal material forms an electrically tunable liquid crystal lens. The liquid crystal material 94 can be sandwiched between two optically transparent substrates 96, along with an electrode layer 98, as illustrated in FIG. 11. Liquid crystal lenses are well known in the art, and not further disclosed herein.

Figure 12:
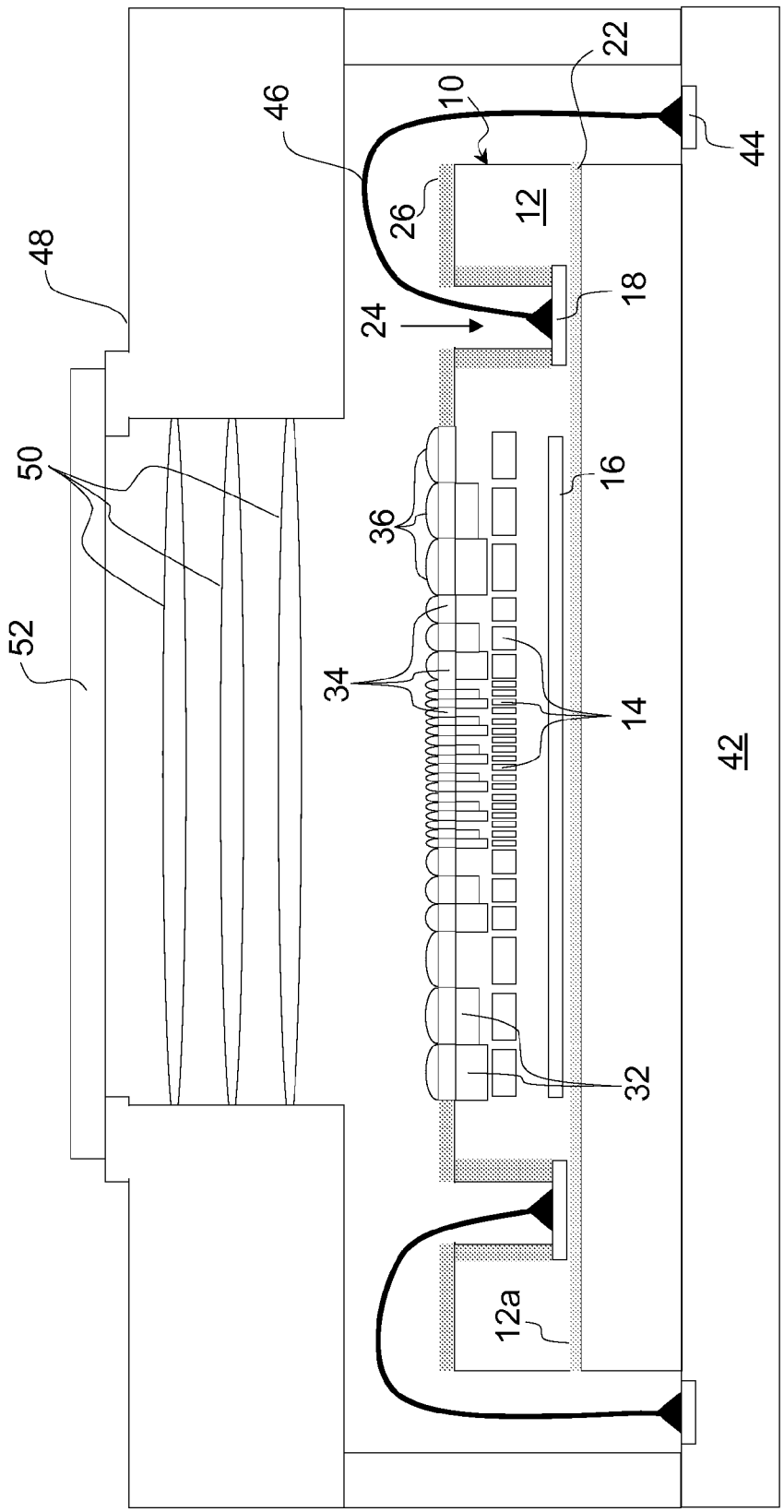
FIG. 12 is a cross sectional side view showing an alternate embodiment of the packaged image sensor of FIG. 4, in which the absorption compensation material 32, the color filters 34 and the microlenses 36 are formed at the substrate surface.
Figure 13:
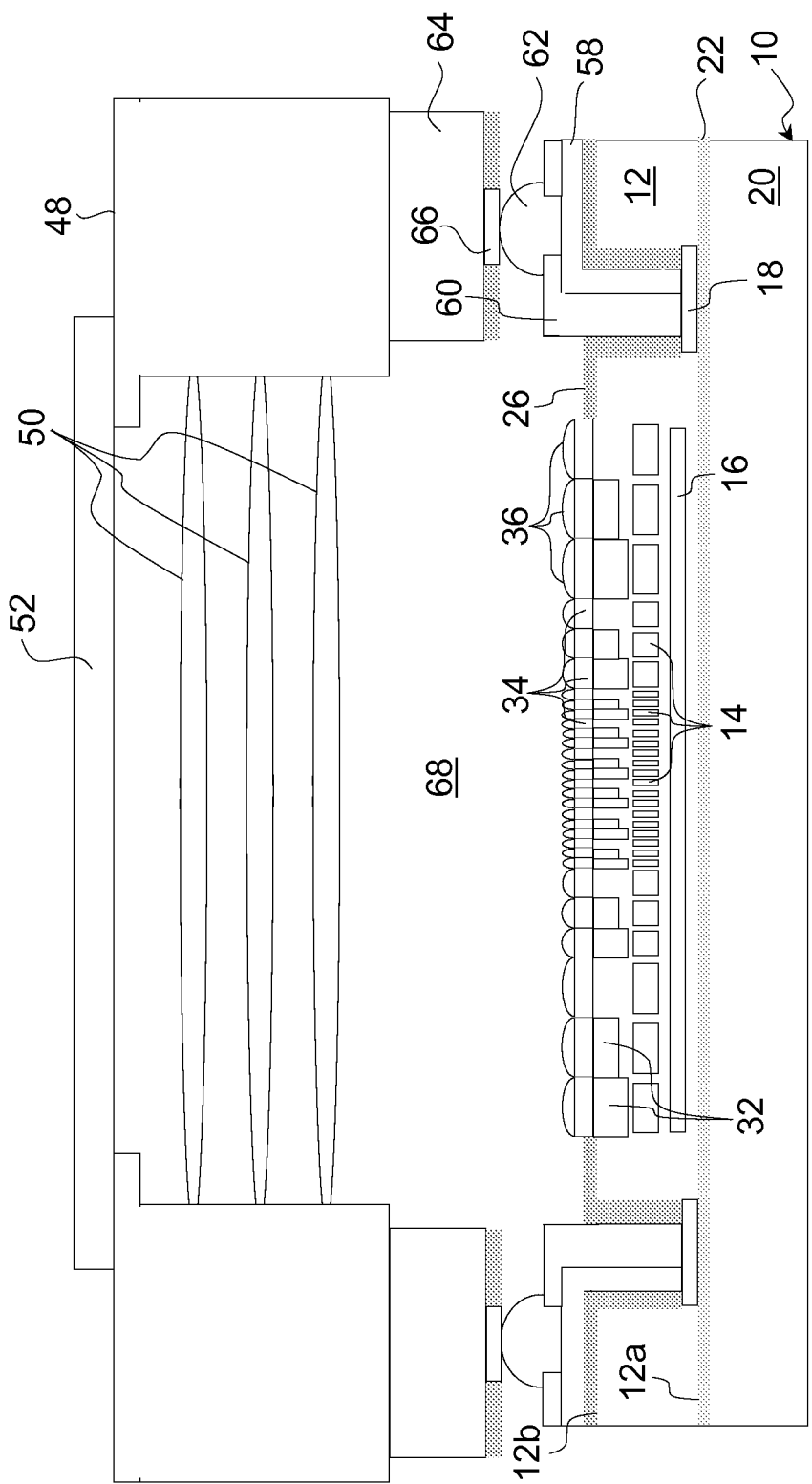
FIG. 13 is a cross sectional side view showing an alternate embodiment of the packaged image sensor of FIG. 5, in which the absorption compensation material 32, the color filters 34 and the microlenses 36 are formed at the substrate surface.
Figure 14:
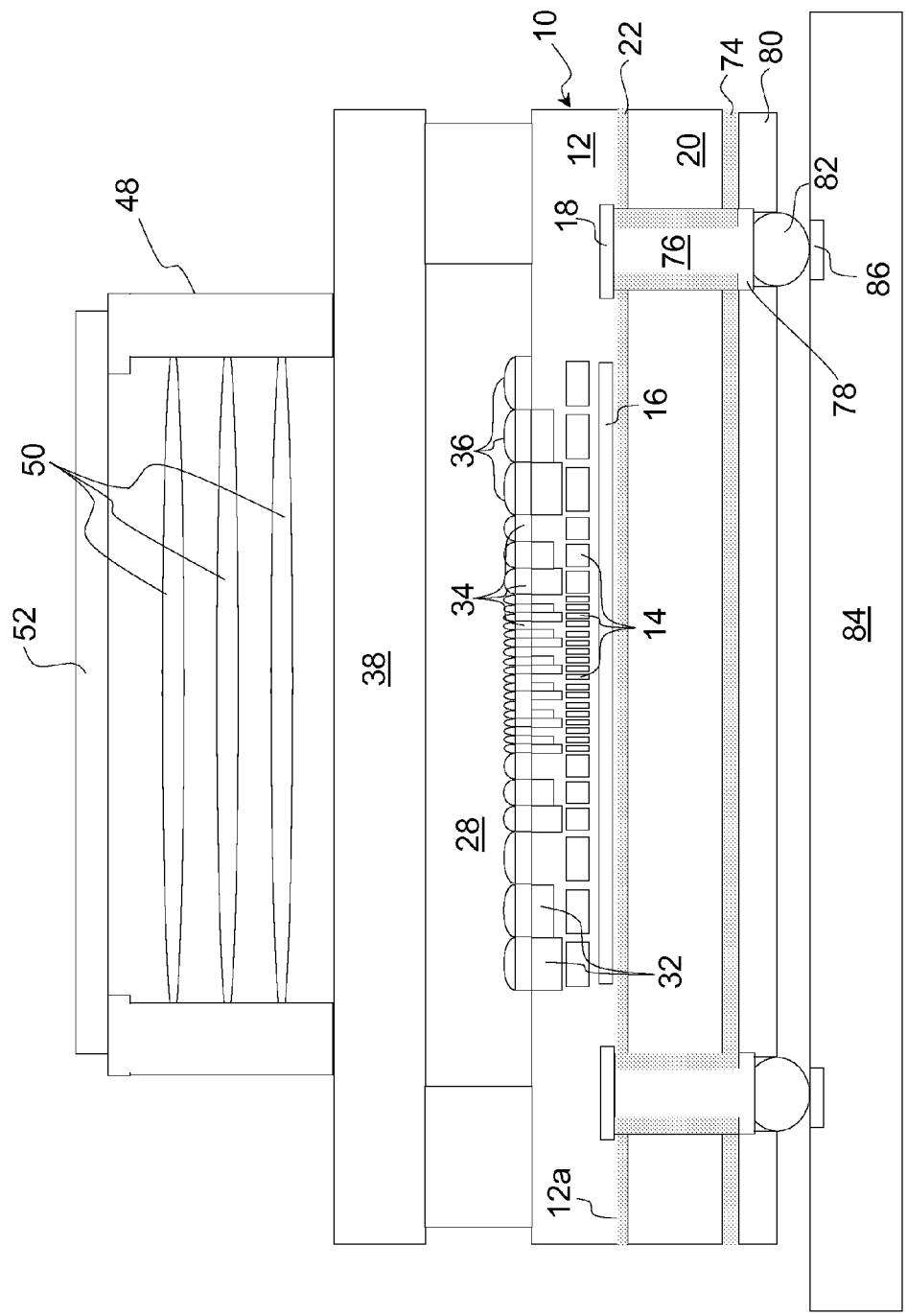
FIG. 14 is a cross sectional side view showing an alternate embodiment of the packaged image sensor of FIG. 6, in which the absorption compensation material, the color filters and the microlenses are formed at the substrate surface.

It should be noted that, depending on the thickness of substrate 10, the formation of the absorption compensation material 32, the color filters 34 and the microlenses 36 can be formed at the substrate back surface 12b instead of at the bottom surface 28a of a cavity 28. Therefore, FIGS. 12-14 illustrate alternate embodiments of those shown in FIGS. 4-6, respectively, where the material 32, filters 34 and microlenses 36 are formed at back surface 12b of substrate 10. Additionally, in alternate embodiments, the absorption compensation material 32 can be omitted from the embodiments of FIGS. 4-6 and 12-14 (i.e. photo detectors of varying lateral sizes but without any absorption compensation material 32).

Figure 15:
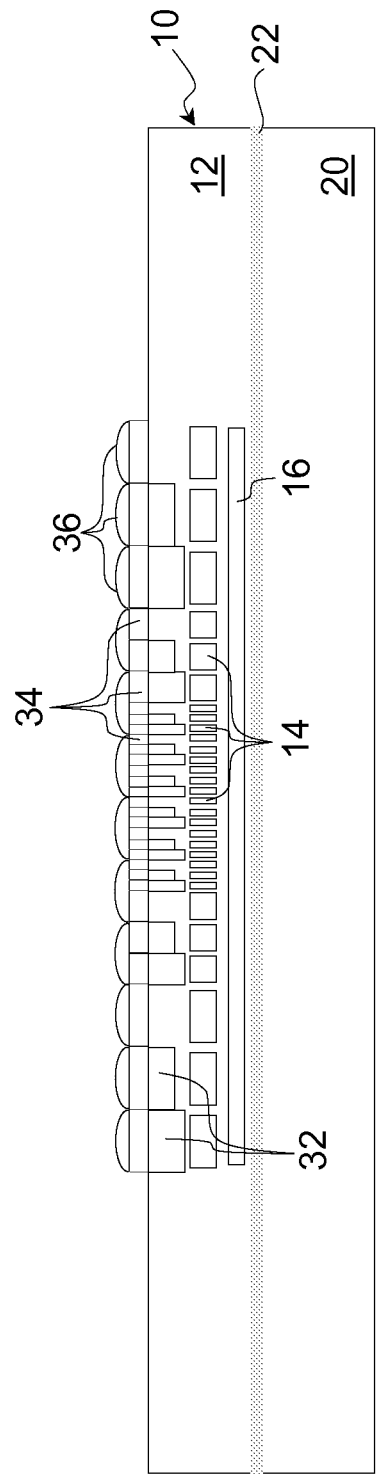
FIG. 15 is a cross sectional side view showing an alternate embodiment of the microlens configuration.

FIG. 15 illustrates a configuration of the microlenses 36 wherein the number of photo-detectors 14 and/or color filters 34 under each of the microlenses 36 varies (e.g. based on the lateral size of the photo-detectors 14 and/or color filters 34). More of the smaller photo-detectors 14 near the center of the array are disposed under a single microlens 36 compared to the larger photo-detectors 14 near the outer edges of the array. Even the sizes of the photo-detectors 14 under a single microlens 36 can vary, as illustrated in FIG. 12.

Figure 16:
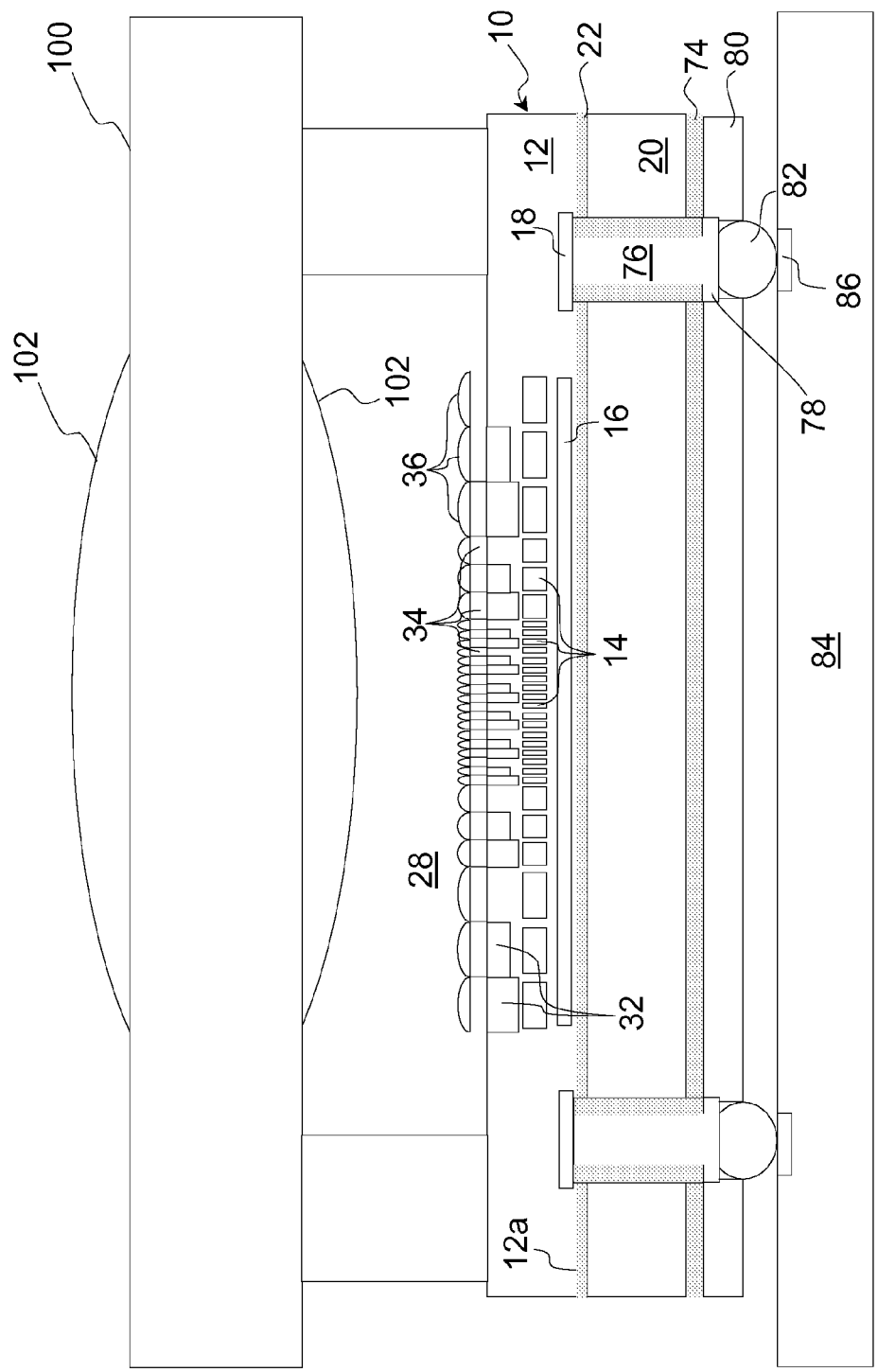
FIG. 16 is a cross sectional side view showing an alternate embodiment of the packaged image sensor of FIG. 14, which utilizes a unitary lens substrate with integrally formed lens portions formed on its upper and lower surfaces.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed, but rather in any order that allows the proper formation of the packaged image sensor chip of the present invention. Color filters 34 and/or microlenses 36 could be disposed in the secondary cavities 30 instead of in cavity 28. Single layers of material could be formed as multiple layers of such or similar materials, and vice versa, and single components can be formed as multiple components, and vice versa. For example, FIG. 16 illustrates an alternate embodiment to that of FIG. 14, wherein lens assembly 48 is replaced with a unitary lens substrate 100 with integrally formed lens portions 102 formed on its upper and lower surfaces. This unitary lens could be used with any of the embodiments described herein.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements therebetween.

What is claimed is:

1. An image sensor device, comprising:
   a substrate that includes:
      a plurality of photo detectors, wherein a first portion of the plurality of photo detectors each has a lateral size that is smaller than that of each of a second portion of the plurality of photo detectors, and
      a plurality of contact pads which are electrically coupled to the photo detectors;
   a plurality of color filters each disposed over one of the photo detectors;
   wherein the plurality of photo detectors are configured to produce electronic signals in response to light incident through the color filters; and
   wherein:
      the plurality of photo detectors is arranged in a two dimensional array in the substrate;
      the first portion of the plurality of photo detectors is disposed proximate a center of the array;
      the second portion of the plurality of photo detectors is disposed proximate a periphery of the array.

2. An image sensor device, comprising:
   a substrate that includes:
      a plurality of photo detectors, wherein a first portion of the plurality of photo detectors each has a lateral size that is smaller than that of each of a second portion of the plurality of photo detectors, and
      a plurality of contact pads which are electrically coupled to the photo detectors;
   a plurality of color filters each disposed over one of the photo detectors;
   wherein the plurality of photo detectors are configured to produce electronic signals in response to light incident through the color filters; and
   wherein:
      the plurality of photo detectors is arranged in a two dimensional array in the substrate;
      the first portion of the plurality of photo detectors is disposed proximate a center of the array;
      the second portion of the plurality of photo detectors is disposed proximate a periphery of the array;
      a third portion of the plurality of photo detectors each has a lateral size that is smaller than that of each of the second portion of the plurality of photo detectors;
      the third portion of the plurality of photo detectors each has a lateral size that is greater than that of each of a first portion of the plurality of photo detector;
      the third portion of the plurality of photo detectors is disposed between the first and second portions of the plurality of photo detectors.

3. The image sensor device of claim 1, wherein a density of the plurality of photo detectors is greater at the center of the array than at the periphery of the array.

4. An image sensor device, comprising:
   a substrate that includes:
      a plurality of photo detectors, wherein a first portion of the plurality of photo detectors each has a lateral size that is smaller than that of each of a second portion of the plurality of photo detectors, and
      a plurality of contact pads which are electrically coupled to the photo detectors;
   a plurality of color filters each disposed over one of the photo detectors;
   wherein the plurality of photo detectors are configured to produce electronic signals in response to light incident through the color filters;
   wherein laterally adjacent ones of the photo detectors are spaced from each other by a spacing that is substantially the same throughout the array.

5. An image sensor device, comprising:
   a substrate that includes:
      a plurality of photo detectors, wherein a first portion of the plurality of photo detectors each has a lateral size that is smaller than that of each of a second portion of the plurality of photo detectors, and
      a plurality of contact pads which are electrically coupled to the photo detectors;
   a plurality of color filters each disposed over one of the photo detectors;
   wherein the plurality of photo detectors are configured to produce electronic signals in response to light incident through the color filters; and
   wherein the substrate has front and back opposing surfaces, and the plurality of contact pads are formed at the front surface, the image sensor device further comprising:
      at least one lens mounted over the substrate for focusing light through the color filters and onto the photo detectors;
      a plurality of holes each extending from the back surface to one of the contact pads;
      a handler attached to the front surface;
      a host board attached to the handler, wherein the host board includes a plurality of contact pads; and
      a plurality of wires each extending from one of the contact pads of the substrate, through one of the holes, and to one of the contact pads of the host board.

6. An image sensor device, comprising:
   a substrate that includes:
      a plurality of photo detectors, wherein a first portion of the plurality of photo detectors each has a lateral size that is smaller than that of each of a second portion of the plurality of photo detectors, and a plurality of contact pads which are electrically coupled to the photo detectors;
a plurality of color filters each disposed over one of the photo detectors;
wherein the plurality of photo detectors are configured to produce electronic signals in response to light incident through the color filters; and
wherein the substrate has front and back opposing surfaces, and the plurality of contact pads are formed at the front surface, the image sensor device further comprising:
at least one lens mounted over the substrate for focusing light through the color filters and onto the photo detectors;
a plurality of holes each extending from the back surface to one of the contact pads;
a plurality of electrically conductive traces each extending from one of the contact pads, along a sidewall of one of the holes, and over the back surface of the substrate; and
a host board disposed over the back surface and having a plurality of contact pads, wherein each of the contact pads of the substrate is electrically connected to one of the contact pads of the host board.

7. The image sensor device of claim 6, wherein the host board includes an aperture disposed over the cavity.

8. An image sensor device, comprising:
a substrate that includes:
a plurality of photo detectors, wherein a first portion of the plurality of photo detectors each has a lateral size that is smaller than that of each of a second portion of the plurality of photo detectors, and
a plurality of contact pads which are electrically coupled to the photo detectors;
a plurality of color filters each disposed over one of the photo detectors;
wherein the plurality of photo detectors are configured to produce electronic signals in response to light incident through the color filters; and
wherein the substrate has front and back opposing surfaces, and the plurality of contact pads are formed at the front surface, the image sensor device further comprising:
at least one lens mounted over the substrate for focusing light through the color filters and onto the photo detectors;
a handler having through-holes extending between first and second surfaces thereof, wherein the first surface is attached to the front surface such that each of the holes is aligned with one of the contact pads;
each of the holes having conductive material therein that extends through the hole from the one contact pad to the second surface.

9. The image sensor device of claim 8, further comprising:
a plurality of SMT interconnects each of which is attached to and electrically connected with the conductive material of one of the holes at the second surface.

10. The image sensor device of claim 1, further comprising:
a plurality of micro-lenses disposed over the photo detectors.

11. The image sensor device of claim 10, wherein each of the plurality of micro-lenses is disposed over just one of the photo detectors.

12. An image sensor device, comprising:
a substrate that includes:
a plurality of photo detectors, wherein a first portion of the plurality of photo detectors each has a lateral size that is smaller than that of each of a second portion of the plurality of photo detectors, and
a plurality of contact pads which are electrically coupled to the photo detectors;
a plurality of color filters each disposed over one of the photo detectors;
wherein the plurality of photo detectors are configured to produce electronic signals in response to light incident through the color filters; and
a plurality of micro-lenses disposed over the photo detectors;
wherein each of a first portion of the plurality of micro-lenses is disposed over a first predetermined number of the first portion of the plurality of photo detectors;
wherein each of a second portion of the plurality of micro-lenses is disposed over a second predetermined number of the second portion photo detectors; and
wherein the first predetermined number is different than the second predetermined number.

13. The image sensor device of claim 12, wherein the first predetermined number is greater than the second predetermined number.

14. The image sensor device of claim 10, further comprising:
an anti-reflective coating on the micro-lenses or under the color filters.

* * * * *